(12) United States Patent
Hao et al.

(10) Patent No.: US 8,525,198 B2
(45) Date of Patent: Sep. 3, 2013

(54) ULTRAVIOLET LIGHT EMITTING DIODE DEVICES AND METHODS FOR FABRICATING THE SAME

(75) Inventors: Yue Hao, Shaanxi (CN); Ling Yang, Shaanxi (CN); Xiaohua Ma, Shaanxi (CN); Xiaowei Zhou, Shaanxi (CN); Peixian Li, Shaanxi (CN)

(73) Assignee: Xidian University, Xi'an (CN)

( * ) Notice: Subject to any disclaimer, the term of this patent is extended or adjusted under 35 U.S.C. 154(b) by 0 days.

(21) Appl. No.: 13/262,049

(22) PCT Filed: Aug. 26, 2009

(86) PCT No.: PCT/CN2009/073519
§ 371 (c)(1),
(2), (4) Date: Sep. 29, 2011

(87) PCT Pub. No.: WO2010/111854
PCT Pub. Date: Oct. 7, 2010

(65) Prior Publication Data
US 2012/0018753 A1 Jan. 26, 2012

(30) Foreign Application Priority Data

| Mar. 31, 2009 | (CN) | 2009 1 0021761 |
| Mar. 31, 2009 | (CN) | 2009 1 0021764 |
| Mar. 31, 2009 | (CN) | 2009 1 0021778 |
| Mar. 31, 2009 | (CN) | 2009 1 0021779 |
| Mar. 31, 2009 | (CN) | 2009 1 0021793 |
| Mar. 31, 2009 | (CN) | 2009 1 0021794 |

(51) Int. Cl.
*H01L 33/00* (2010.01)
(52) U.S. Cl.
USPC ................ 257/97; 257/E33.034
(58) Field of Classification Search
USPC ............................. 257/97, E33.034
See application file for complete search history.

(56) References Cited

U.S. PATENT DOCUMENTS

| 5,739,554 A | * | 4/1998 | Edmond et al. ........... 257/103 |
| 2002/0185653 A1 | * | 12/2002 | Kurahashi et al. ........ 257/99 |
| 2008/0258131 A1 | | 10/2008 | Kim | |

FOREIGN PATENT DOCUMENTS

| CN | 1900386 A | 1/2007 |
| CN | 101132022 A | 2/2008 |
| WO | 2007005984 A1 | 1/2007 |

OTHER PUBLICATIONS

PCT/CN2009/073519 International Search Report, Jan. 14, 2010.

* cited by examiner

*Primary Examiner* — Matthew Reames
(74) *Attorney, Agent, or Firm* — Workman Nydegger

(57) ABSTRACT

A UV LED device and the method for fabricating the same are provided. The device has aluminum nitride nucleating layers, an intrinsic aluminum gallium nitride epitaxial layer, an n-type aluminum gallium nitride barrier layer, an active region, a first p-type aluminum gallium nitride barrier layer, a second p-type aluminum gallium nitride barrier layer, and a p-type gallium nitride cap layer arranged from bottom to top on a substrate. A window region is etched in the p-type gallium nitride cap layer for emitting the light generated.

10 Claims, 15 Drawing Sheets

ULTRAVIOLET LIGHT EMITTING DIODE DEVICES AND METHODS FOR FABRICATING THE SAME

BACKGROUND OF THE INVENTION

1. Field of the Invention

The present invention relates to light emitting diode (hereinafter referred to as "LED") devices and methods for fabricating the same, and more particularly, to AlGaN-based multi-quantum well ultraviolet (UV) LED devices with improved light emission intensity and methods for fabricating the same.

2. Background and Relevant Art

Group III-V compound semiconductor materials which are representative of the third generation semiconductor materials have many excellent properties, and particularly in terms of optical application, alloys {Ga(Al, In)N} consisting of Ga, Al, In and N may be suitable for both the visible light region and the near-UV light region. Furthermore, group III nitrides having wurtzite structure are of direct band gap and very suitable for photoelectronic device application. AlGaN-based multi-quantum well UV LED devices, as a focus of current UV photoelectronic device development, have exhibited great advantages especially for UV light region. However, as the wavelength of light emitted from the LED devices becomes shorter, Al composition in active layer of the GaN-based LED devices is increasingly high. Therefore, it is difficult to fabricate a high quality AlGaN material. Particularly, the external quantum efficiency and the light power of the UV LED devices are very low because the AlGaN material absorbs UV light strongly, which have become a bottleneck for developing the UV LED devices and a problem to be solved currently.

AlGaN-based multi-quantum well UV LED devices have a bright application prospect. Firstly, there has been a breakthrough in the development of GaN-based blue-green light LED devices, the GaN-based blue-green light LED devices have been commercially available and applied in view illumination, large-size backlight source, light communication, etc. Secondly, white solid illumination LED devices have been developing rapidly, initiating the $3^{rd}$ illumination revolution. Thirdly, as well developed in the visible light field, short wavelength UV light have been received more and more attention, the UV light has been found to be valuable in screen printing, polymer solidification, environment protection, white light illumination and military survey.

Presently, some new material growth methods or new structures are used for reducing damage due to stress to the quality of AlGaN material, in order to improve the growth quality of AlGaN material, thereby improving light emission performance of the UV LED devices. These methods comprising:

A UV LED device with a wavelength less than 300 nm was first achieved in South Carolina State University in 2002. An LED device with a wavelength of 285 nm was fabricated on a sapphire substrate, and for a 200μ×200 μchip, the power was 0.15 mW at a pulse current of 400 mA, the maximum power of which is up to 0.25 mW after an improvement for p-type and n-type contact resistances, referring to V. Adivarahan, J. P. Zhang, A. Chitnis, et al, "sub-Milliwatt Power III-N Light Emitting Diodes at 285 nm," Jpn. J. Appl. Phy, 2002, 41: L435. Subsequently, LED devices with emission wavelengths of 280 nm, 269 nm, 265 nm were achieved in sequence, the maximum power of which exceeds 1 mW, referring to W. H. Sun, J. P. Zhang, V. Adivarahan, et al. "AlGaN-based 280 nm light-emitting diodes with continuous wave powers in excess of 1.5 mW" Appl Phys Lett, 2004, 85 (4): 531; V. Adivarahan, S. Wu, J. P. Zhang, et al. "High-efficiency 269 nm emission deep ultraviolet light-emitting diodes" Appl. Phys. Lett, 2004, 84 (23):4762; Y. Bilenko, A. Lunev, X. Hu, et al. "10 Milliwatt Pulse Operation of 265 nm AlGaN Light Emitting Diodes" Jpn. J. Appl. Phys, 2005, 44:L98. In order to improve current transmission and to reduce heat effect, for a small area chip of 100 μm×100 μm, connected in a 2×2 array with a flip-chip structure, the maximum power of 24 mW was obtained at a wavelength of 280 nm and the maximum external quantum efficiency is up to 0.35%, referring to W. H. Sun, J. P. Zhang, V. Adivarahan, et al. "AlGaN-based 280 nm light-emitting diodes with continuous wave powers in excess of 1.5 mW" Appl. Phys. Lett, 2004, 85 (4): 531. An LED device with a wavelength of 250 nm was further fabricated in 2004, and for a 200μ×200 μchip, the maximum power is nearly 0.6 mW; however, the external quantum efficiency is only 0.01%, referring to V. Adivarahan, W. H. Sun, A. Chitnis, et al. "250 nm AlGaN light-emitting diodes" Appl. Phys. Lett, 2004, 85 (12): 2175.

A further development for deep UV, particularly in the wavelength range of 280-290 nm, was achieved in Northwest University and Kansas State University in 2004, referring to Fischer. A. J, Allerman. A. A, et al. "Room-temperature direct current operation of 290 nm Light-emitting diodes with milliwatt power level" [J]. Appl. Phys. Lett, 2004, 84 (20):3394. A high power UV LED device of 1 mm×1 mm size was obtained using interdigitated contact geometry for improving internal current spreading and a flip-chip structure for improving heat dissipation, with an emission wavelength of 290 nm, an emission efficiency of 1.34 mW at a direct current of 300 mA, and the external quantum efficiency of 0.11%, referring to Kim. K. H, Fan. Z. Y, Khizar M, et al. "AlGaN-based ultraviolet light-emitting diodes grown on AlN epilayers" [J]. Appl. Phys. Lett, 2004, 85 (20):4777.

Also in 2004, deep UV LED devices with wavelengths of 250 nm and 255 nm were further developed in South Carolina State University. An AlGaN/AlN super-lattice structure was used in a bottom buffer layer, and an AlGaN barrier layer with high quality was grown, and thereby a deep UV LED device of 200 μm×200 μm size was fabricated, the emission efficiencies of which are 0.16 mW and 0.57 mW, respectively at pulse currents of 300 mA and 400 mA. However, due to the bottom emission type, the emission efficiency was still low, referring to V. Adivarahan, W. H. Sun, A. Chitnis, M. Shatalov, S. Wu, H. P. Maruska, M. Asif. Khan. "250 nm AlGaN light-emitting diodes" Appl. Phys. Lett, 2004, 85 (12):2175.

Deep UV LED devices with wavelengths in the range of 231-261 nm were further developed in Saitama University in 2007 in Japan. Since an AlN buffer layer was formed through pulse grown technique and dislocation defect density of AlN layer was further reduced, an AlGaN layer with high Al composition was grown, thereby the light power and external quantum efficiency of the deep UV LED device with a wavelength of 261 nm were 1.65 nW and 0.23%, respectively, referring to Hirayama Hideki, Yatabe Tohru, Noguchi Norimichi, Ohashi Tomoaki, Kamata Norihiko "231-261 nm AlGaN deep-ultraviolet light-emitting diodes fabricated on AlN multilayer buffers grown by ammonia pulse-flow method on sapphire" Appl. Phys. Lett, 2007, 91 (7):071901-1.

In summary, currently, AlGaN-based deep UV LED devices are mainly fabricated as the bottom emission type, and the top emission type LED devices haven't been studied in depth. With decrease of the emission wavelength, the bottom buffer layer absorbs UV light increasingly, thereby producing an adverse effect on the light emission power and external quantum efficiency. Currently, the quality of epitaxial layers is improved mainly by modifying the structure of devices. However, existing bottom emission type LED devices have following disadvantages: first, the emission path of light is too long and light loss on the path is too large, causing the external quantum efficiency to be low. Secondly, the crystallizing quality of bottom AlN buffer layer is poor, thereby causing increased non-radiative recombination centers in the material and increased UV light being absorbed. Thirdly, there are increased defects of trapping photons in the bottom buffer layer under electrical stress, adversely affecting the reliability of the devices.

BRIEF SUMMARY OF THE INVENTION

In view of the above problems, it is an object of the present invention to provide a UV LED device with high reliability, low cost and simple processes, and method for fabricating the same, with varied light emission path, improved light power and external quantum efficiency.

In accordance with the present invention, a UV LED device is provided, characterized in that: the UV LED device comprises AlN nucleating layers (2, 3), an intrinsic AlGaN epitaxial layer (4), an AlGaN barrier layer (5) of a first conductivity type, an active region (6), a first AlGaN barrier layer (7) of a second conductivity type, a second AlGaN barrier layer (8) of the second conductivity type and a GaN cap layer (9) of the second conductivity type grown in sequence on a substrate (1); a window (10, W, A) is disposed in the GaN cap layer (9) of the second conductivity type for emitting the light generated. The window (10, W, A) has one of shapes of substantially cone, semi-sphere and cylindrical.

In one aspect of the present invention, the substrate (1) is a SiC substrate or a sapphire substrate; if the substrate is the SiC substrate, an electrode of the first conductivity type is formed on the back of the SiC substrate, and an electrode of the second conductivity type is formed on the GaN cap layer (9) of the second conductivity type; and if the substrate is the sapphire substrate, an electrode of the first conductivity type is formed on the AlGaN barrier layer (5) of the first conductivity type, and an electrode of the second conductivity type is formed on the GaN cap layer (9) of the second conductivity type.

Following technical effects are achieved by the present invention:

Since the device according present invention has a top window structure, not only the light emission aperture is improved, but also the light emission from the window is enhanced. Even defects in the AlN buffer layer of the device are increased due to electric stress, the power of light emission would not be influenced, which would facilitate the practical application of AlGaN-based UV LED device with SiC substrate.

In addition, in the fabrication of the top window structure, the semi-sphere, cone, etc. shape windows are formed by wet etching the p-GaN cap layer to the p-type AlGaN barrier layer with the aid of light, so that the UV light emitted can exit from the top, and light emission power and external quantum efficiency of the device can be improved.

Furthermore, in present invention, the window is formed by a dry etching, so that the surface of the electronic barrier layer p-AlGaN at bottom of the window is roughened, and the light emission efficiency is further improved.

Also, according to present invention, the process for fabricating the device is fully compatible with the mature process for fabricating the blue-light GaN based LED devices, thereby the cost is low and the process is simple.

DETAILED DESCRIPTION OF THE PREFERRED EMBODIMENTS OF THE INVENTION

Structure of a UV LED Device and Modifications Thereof

Figure 1A:
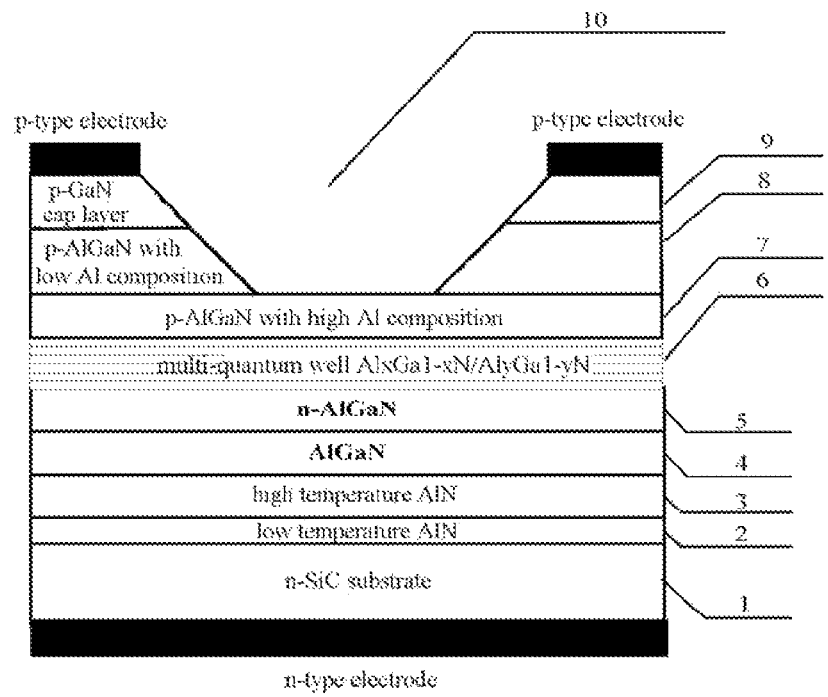
FIGS. 1A-1F are cross sectional views schematically illustrating a UV LED device according to the present invention.

FIG. 1A is a cross sectional view schematically illustrating a UV LED device according to the present invention.

As shown in FIG. 1A, a UV LED device according to the present invention has an n-type SiC substrate 1; a low-temperature AlN nucleating layer 2 grown on the Sic substrate 1; a high-temperature AlN nucleating layer 3 grown on the low-temperature AlN nucleating layer 2; an AlGaN epitaxial layer 4 grown on the high-temperature AlN nucleating layer 3; an n-type AlGaN barrier layer 5 grown on the AlGaN epitaxial layer 4; an active region 6 grown on the n-type AlGaN barrier layer 5, wherein the active region 6 comprises $Al_xGa_{1-x}N/Al_yGa_{1-y}N$ with multi-quantum well structure; a p-type AlGaN barrier layer 7 with high Al composition grown on the active region 6; a p-type AlGaN barrier layer 8 with low Al composition grown on the p-type AlGaN barrier layer 7; and a p-type GaN cap layer 9 grown on the p-type AlGaN barrier layer 8. An approximately conical window 10 is arranged on the p-type cap layer 9, so that light generated by the UV LED device of the present invention can be emitted from the GaN cap layer 9.

Further, an n-type electrode is deposited on a side of the SiC substrate 1, opposite to the side on which the low-temperature AlN nucleating layer 2 is grown, and a p-type electrode is deposited on the p-type cap layer 9.

Hereinabove, the structure of the UV LED device according to present invention as illustrated in FIG. 1A has been described. However, the present invention is not limited to this, and various modifications can be made according to principles of the present invention. Hereinafter, various modifications are illustrated with respect to FIGS. 1B-1F.

In the UV LED device shown in FIG. 1A, the substrate is an n-type SiC substrate and the window is shaped like a cone.

Figure 1B:
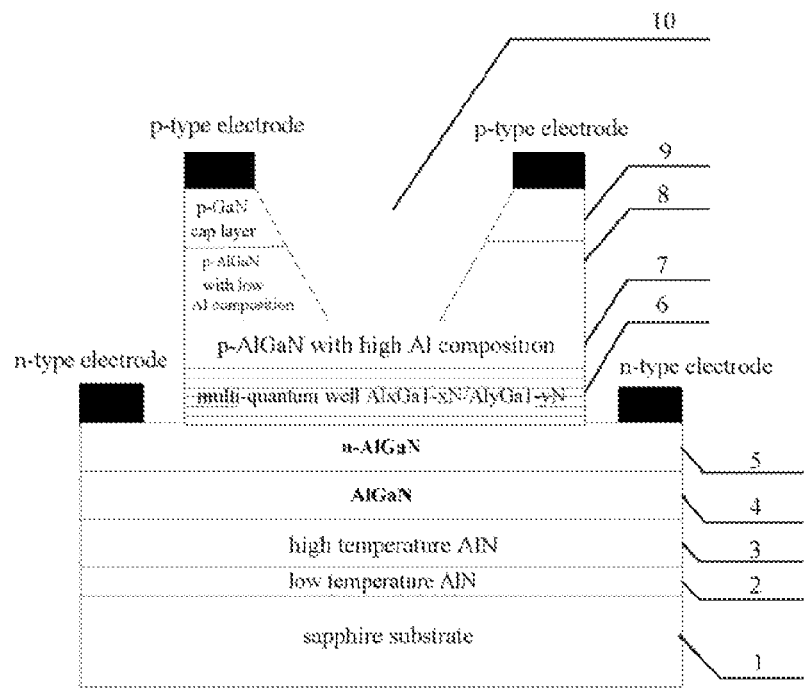
Figure 1C:
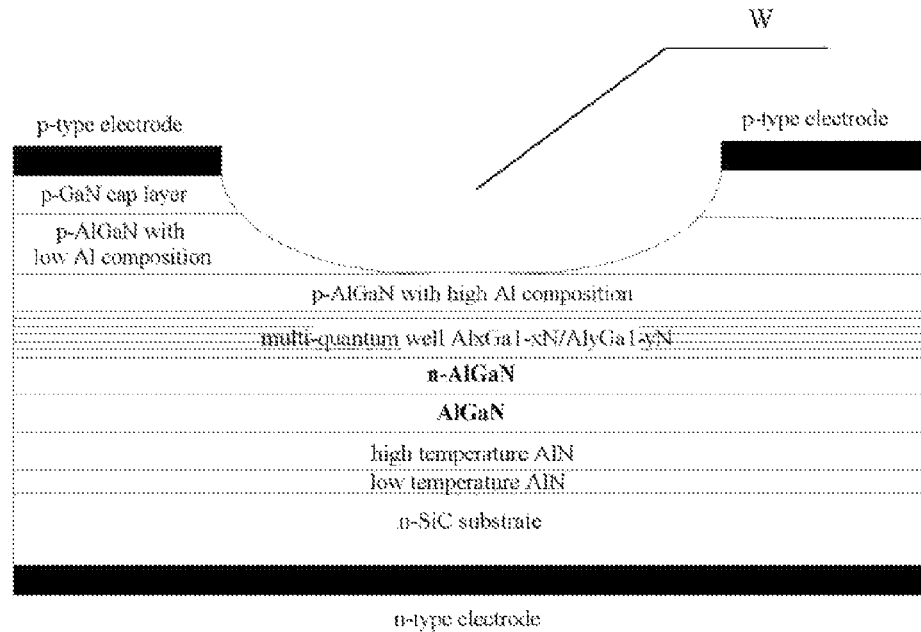
Figure 1D:
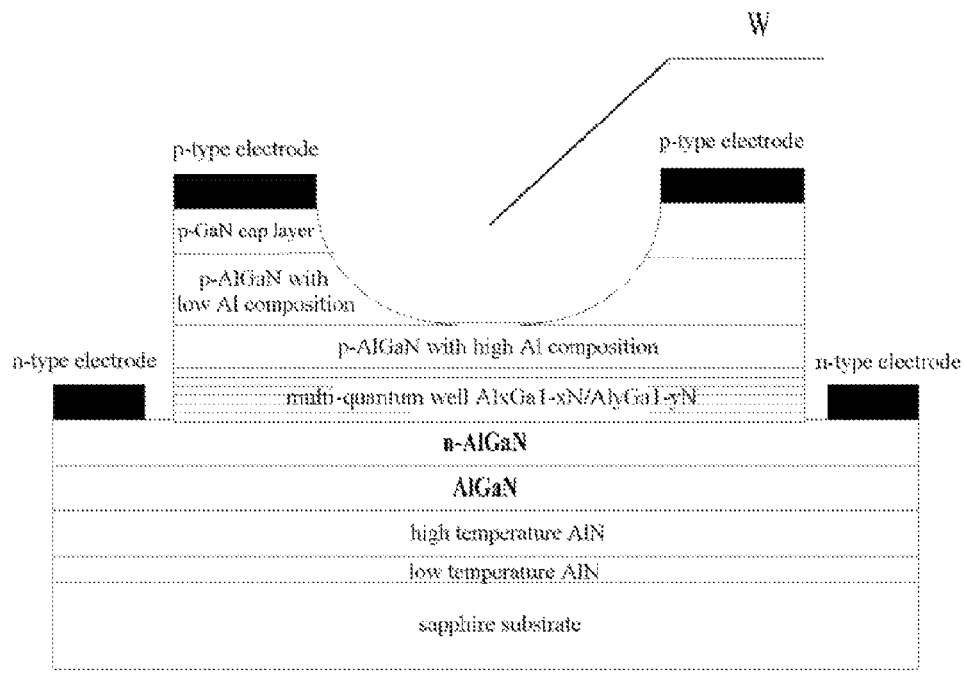
Figure 1E:
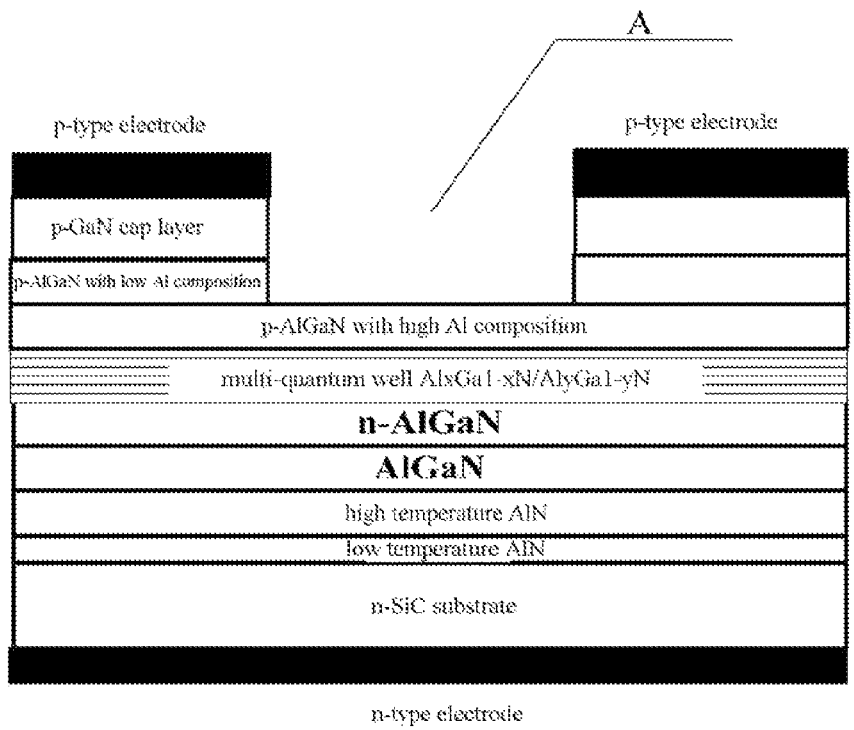
Figure 1F:
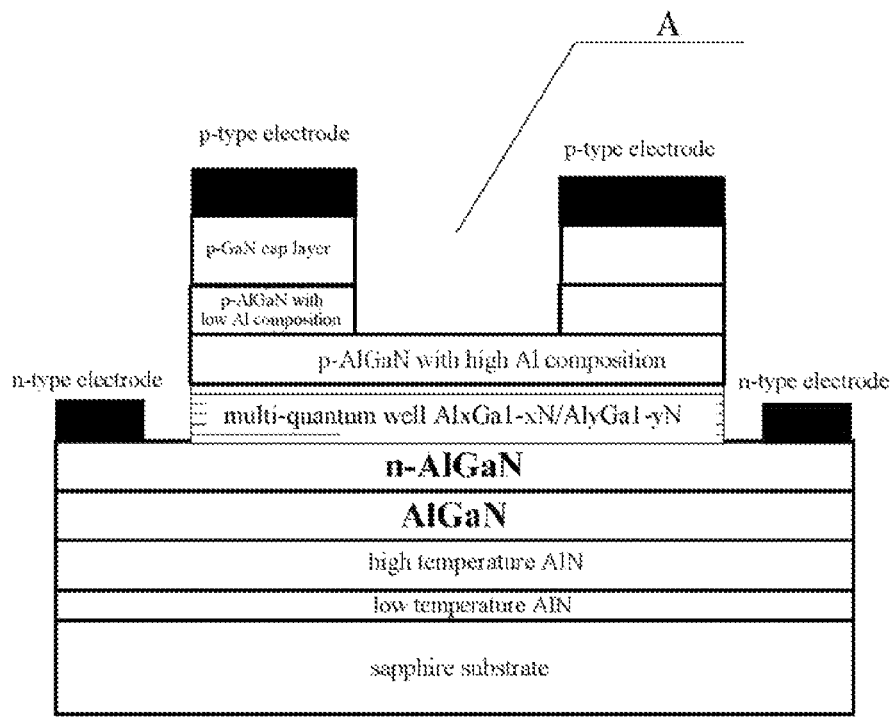

However, the present invention is not limited to this, the substrate can be formed from other material, such as sapphire substrate (shown in FIGS. 1B, 1D, 1F). Also, the window can be of other shapes, such as cylindrical (shown in FIGS. 1E, 1F) or semi-sphere (shown in FIGS. 1C, 1D).

In the UV LED devices shown in FIGS. 1B, 1D and 1F, the substrate is a sapphire substrate, an n-type electrode is formed on the n-type AlGaN barrier layer 5, and a p-type electrode is formed on the p-type GaN cap layer 9.

Furthermore, the depth of the window can be set so that the light generated from the UV LED device can be emitted, preferably, the window 10 penetrates through the p-type GaN cap layer 9 and the p-type AlGaN barrier layer 8 with low Al composition, and reaches the AlGaN barrier layer 7 with high Al composition. Naturally, the depth can be differently set according to the shape of the window.

For example, if the shape of the window is approximately conical, the bottom of the window is preferably located at two-thirds of the thickness of the p-type AlGaN barrier layer 7 with high Al composition.

If the shape of the window is approximately semi-sphere, the bottom of the window is preferably located at four-fifths of the thickness of the p-type AlGaN barrier layer 7 with high Al composition; further, a ratio of the top width to the bottom width of the window is 2:1.

If the shape of the window is approximately cylindrical, the bottom of the window is preferably located at three-fourths of the thickness of the p-type AlGaN barrier layer 7 with high Al composition; further, a ratio of the depth to the width of the window is 1:1000.

Method for Fabricating the UV LED Device

First Embodiment

Hereinafter, a method for fabricating the UV LED device shown in FIG. 1E having a SiC substrate and a cylindrical window, is described with respect to FIGS. 2A and 2B.

Figure 2A:
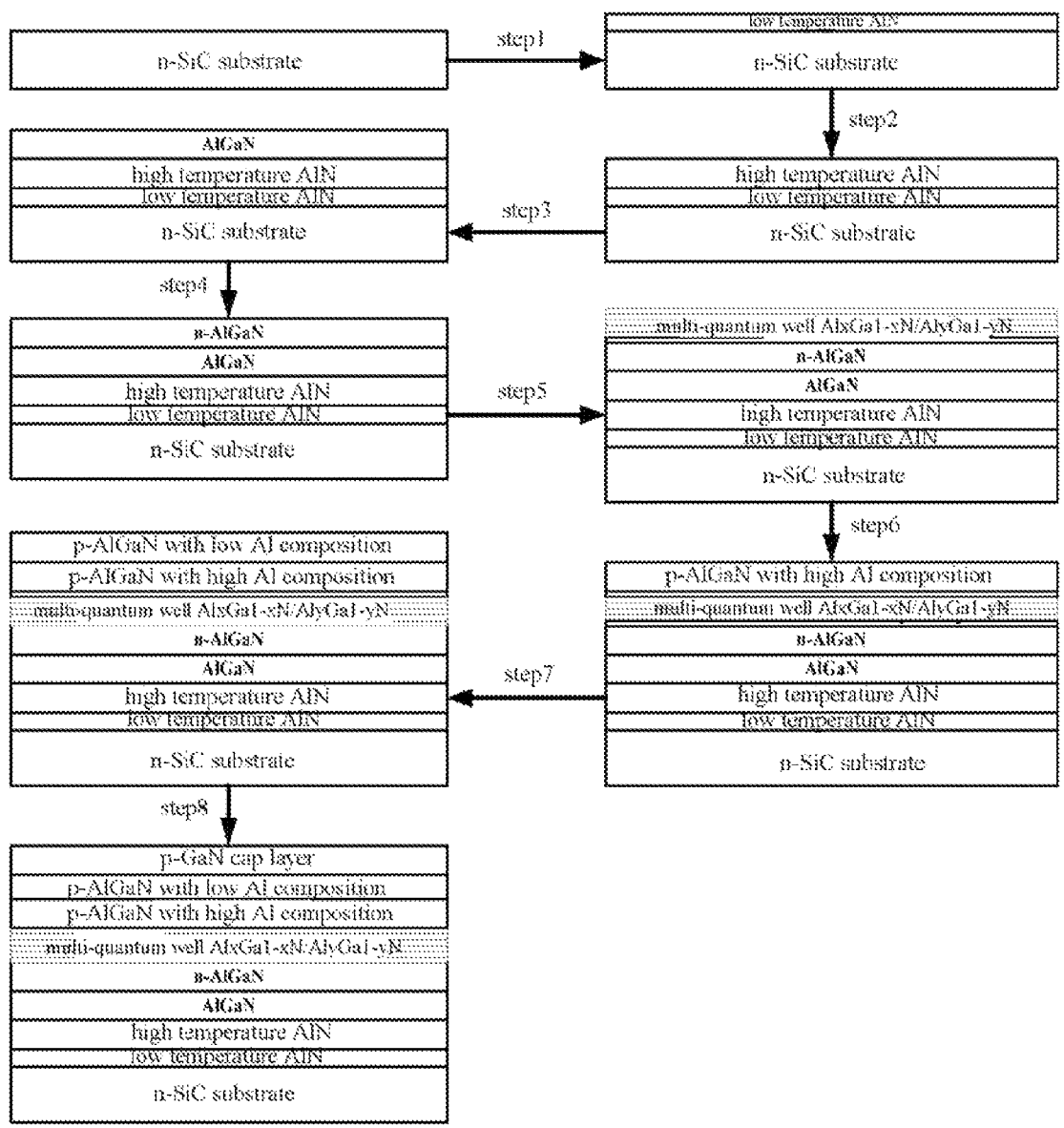
FIGS. 2A-2B are flowcharts illustrating a method for fabricating a UV LED device according to one embodiment of the present invention (SiC substrate, cylindrical window)

First, a material growth step is shown is FIG. 2A:

At step 1, on the SiC substrate, a low-temperature AlN nucleating layer is grown by a MOCVD process.

Lowering a temperature of the substrate to 600° C.; retaining a growing pressure of 50 Torr, a flow rate of 1500 sccm of hydrogen gas, a flow rate of 1500 sccm of ammonia gas; introducing an Al source at a flow rate of 28 μmol/min into a reaction chamber; and growing the low-temperature AlN nucleating layer with a thickness of 3 nm.

At step 2, on the low-temperature AlN nucleating layer, a high-temperature AlN nucleating layer is grown.

Raising a growing temperature to 1050° C.; retaining the growing pressure of 50 Torr, the flow rate of 1500 sccm of hydrogen gas, the flow rate of 1500 sccm of ammonia gas; introducing the Al source at a flow rate of 28 μmol/min into the reaction chamber; and growing the high-temperature AlN nucleating layer with a thickness of 20 nm.

At step 3, an AlGaN epitaxial layer is grown on the high-temperature AlN nucleating layer.

Maintaining the growing temperature at 1050° C.; retaining the growing pressure of 110 Torr, the flow rate of 1500 sccm of hydrogen gas, the flow rate of 1100 sccm of ammonia gas; introducing the Al source at a flow rate of 50 μmol/min and the gallium source at a flow rate of 80 μmol/min into the reaction chamber; and growing the undoped AlGaN epitaxial layer with a thickness of 1200 nm.

At step 4, a Si-doped n-type AlGaN barrier layer is grown on the AlGaN epitaxial layer.

Maintaining the growing temperature at 1050° C.; retaining the growing pressure of 110 Torr, the flow rate of 1500 sccm of hydrogen gas, the flow rate of 1500 sccm of ammonia gas; introducing the Al source at a flow rate of 55 μmol/min and the gallium source at a flow rate of 65 μmol/min and a Si source at a flow rate of 1-3 μmol/min into the reaction chamber; and growing the Si-doped AlGaN barrier layer with a thickness of 600 nm.

At step 5, on the n-type AlGaN barrier layer, a multi-quantum well $Al_xGa_{1-x}N/Al_yGa_{1-y}N$ layer (x<y), i.e., an active region 6 is grown.

Maintaining the growing temperature at 1050° C.; retaining the growing pressure of 120 Torr, the flow rate of 1500 sccm of hydrogen gas, the flow rate of 1500 sccm of ammonia gas; introducing the Al source at a flow rate of 65 μmol/min and the gallium source at a flow rate of 80 μmol/min into the reaction chamber; and growing the $Al_xGa_{1-x}N$ barrier layer with a thickness of 2-7 nm. Then, Maintaining the growing temperature at 1050° C.; retaining the growing pressure of 70 Torr, the flow rate of 1500 sccm of hydrogen gas, the flow rate of 1500 sccm of ammonia gas; introducing the Al source at a flow rate of 80 μmol/min and the gallium source at a flow rate of 65 μmol/min into the reaction chamber; and growing the $Al_yGa_{1-y}N$ barrier layer with a thickness of 2-10 nm and the period of 3-5 of the quantum wells.

At step 6, a p-type AlGaN barrier layer 7 with high Al composition of 40%-60% (mole ratio, ditto) is grown on the multi-quantum well $Al_yGa_{1-y}N/Al_yGa_{1-y}N$ layer.

Maintaining the growing temperature at 1000° C.; retaining the growing pressure of 100 Torr, the flow rate of 1500 sccm of hydrogen gas, the flow rate of 1500 sccm of ammonia gas; introducing the Al source at a flow rate of 100 μmol/min and the gallium source at a flow rate of 70 μmol/min and a Mg source at a flow rate of 3-5 μmol/min into the reaction chamber; and growing the p-type AlGaN barrier layer with high Al composition with a thickness of 70 nm.

At step 7, a p-type AlGaN barrier layer with low Al composition of 10%-25% (mole ratio) is grown on the p-type barrier layer.

Maintaining the growing temperature at 1000° C.; retaining the growing pressure of 100 Torr, the flow rate of 1500 sccm of hydrogen gas, the flow rate of 1500 sccm of ammonia gas; introducing the Al source at a flow rate of 80 μmol/min and the gallium source at a flow rate of 120 μmol/min and the Mg source at a flow rate of 3-5 μmol/min into the reaction chamber; and growing the p-type AlGaN barrier layer with low Al composition with a thickness of 60 nm.

At step 8, a p-type GaN cap layer is grown on the p-type AlGaN barrier layer with low Al composition.

Maintaining the growing temperature at 950° C.; retaining the growing pressure of 70 Torr, the flow rate of 1500 sccm of hydrogen gas, the flow rate of 1500 sccm of ammonia gas; introducing the gallium source at a flow rate of 65 μmol/min and the Mg source at a flow rate of 3-5 μmol/min into the reaction chamber; and growing the p-type GaN cap layer with a thickness of 60 nm.

Figure 2B:
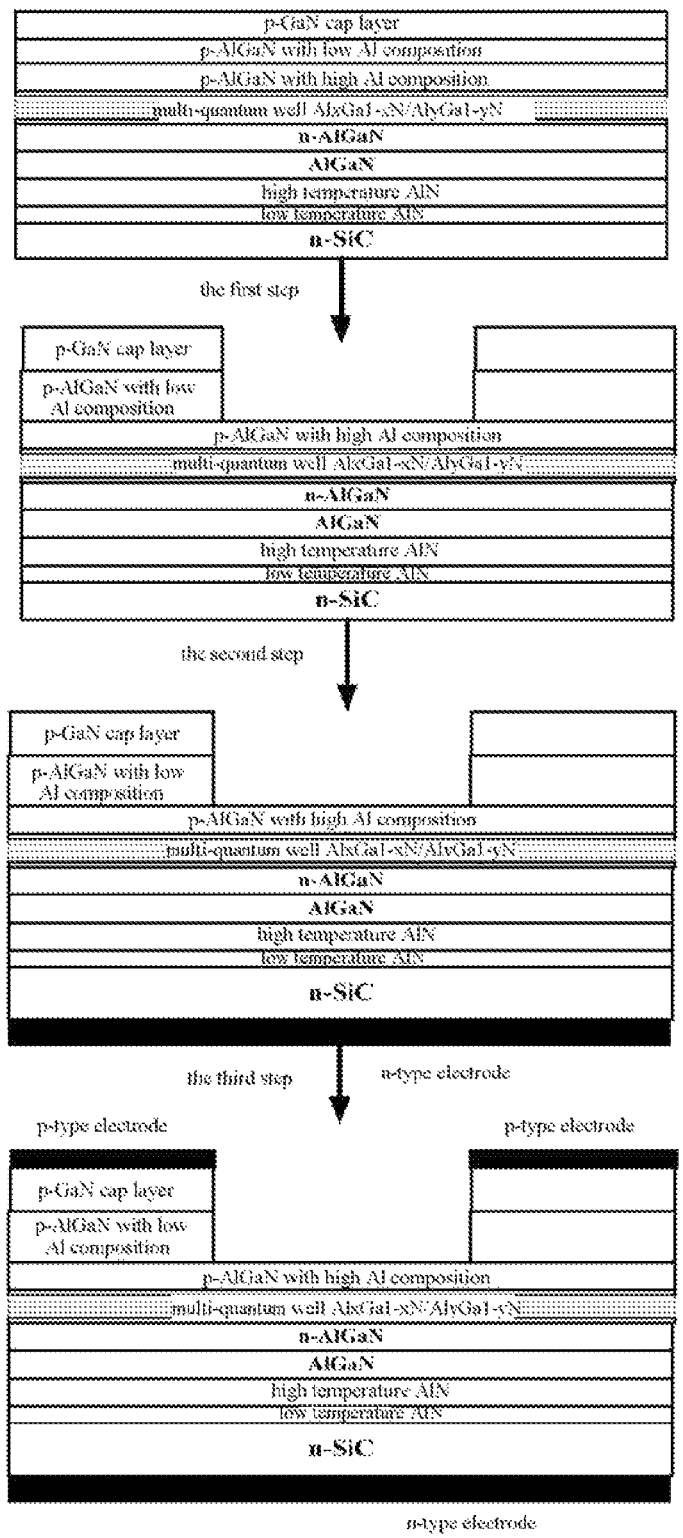

Next, a device fabrication step is shown in FIG. 2B.

At the first step, by photo-lithographing a circular window on the p-type GaN cap layer and etching the window to the p-type AlGaN barrier layer with high Al composition using ICP (Inductively coupled plasma), a cylindrical window A is formed.

(1) firstly, by coating a positive photoresist at a rotation speed of 5000 revolutions/min on a sample wafer by a photoresist coating machine, and then baking the coated sample wafer in a baking box at 90° C. for 15 minutes, a desired window for etching is formed through photolithography and developing processes;

(2) next, by dry etching the p-type GaN cap layer to the p-type AlGaN barrier layer with high Al composition using ICP, with an etching gas of $Cl_2/BCl_3$, an etching depth of 135 nm, an etching electrode power of 240 W, a bias voltage of 80V, a pressure of 1 Pa, and an etching time of 180 s, a cylindrical window A is formed.

At the second step, an n-type electrode pattern is photo-lithographed on the back of the n-type SiC substrate, and an n-type ohmic contact metal is evaporated on the electrode pattern region by an electronic beam evaporation process, thereby forming an n-type electrode.

(1) first, in order for metal to be better stripped off, coating an adhesive on the sample wafer at a rotation speed of 8000 revolutions/min for 30 seconds, and baking the coated sample wafer in a baking box at 160° C. for 20 minutes, then coating the positive photoresist on the sample wafer at a rotation speed of 5000 revolutions/min, and then baking the coated sample wafer in the baking box at 80° C. for 10 minutes, thereby photo-lithographing the n-type electrode pattern;

(2) next, removing the thin photoresist layer undeveloped on the pattern region with a DQ-500 plasma photoresist removing machine in order to improve yield in the stripping off step, then depositing Ni/Au two-layer metal with a VPC-1000 electronic beam evaporation device;

(3) next, dipping the deposited sample wafer into acetone solution for 40 minutes, ultrasonic processing the same, and then blowing dry nitrogen gas over the wafer;

(4) then, putting the sample wafer into a rapid annealing oven, with the annealing oven being provided with nitrogen gas for 10 minutes, then high temperature annealing the sample wafer at the temperature of 1000° C. for 65 seconds, thereby forming the n-type electrode.

At the third step, a p-type electrode pattern is photo-lithographed on the p-type GaN cap layer, and a p-type ohmic contact metal is evaporated on the electrode pattern region by an electronic beam evaporation process, thereby forming a p-type electrode.

(1) first, coating an adhesive on the sample wafer at a rotation speed of 8000 revolutions/min for 30 seconds, and baking the coated sample wafer in a baking box at 160° C. for 20 minutes, then coating the positive photoresist on the sample wafer by a photoresist coating machine at a rotation speed of 5000 revolutions/min, then baking the coated sample wafer in a baking box at 80° C. for 10 minutes, thereby photo-lithographing the p-type electrode pattern;

(2) next, removing the thin photoresist layer undeveloped on the pattern region with a DQ-500 plasma photoresist removing machine, then evaporating Ni/Au two-layer metal, as the p-type electrode, in the p-type electrode pattern with a VPC-1000 electronic beam evaporation device;

(3) next, dipping the evaporated sample wafer into acetone solution for 20 minutes, ultrasonic processing the same, and then blowing dry nitrogen gas over the wafer; subsequently, putting the sample wafer into a rapid annealing oven, then high temperature annealing the sample wafer in air at the temperature of 560° C. for 10 minutes, thereby forming the p-type electrode. The fabrication of the device is completed.

Hereinabove the first embodiment has been described, the modifications 1-5 of the first embodiment will be explained below. In the modifications 1-5, both the material growth step and the device fabrication step are also included. The material growth step is the same as that in the first embodiment, thereby omitting detailed description for the same step.

Modification 1 of the First Embodiment

The difference between the present modification and the first embodiment is that, in the (2) of the first step of the device fabrication step, by dry etching the p-type GaN cap layer to the p-type AlGaN barrier layer with high Al composition using ICP, with an etching depth of 135 nm, an etching gas of $Cl_2/BCl_3$, an etching electrode power of 450 W, a bias voltage of 60V, a pressure of 2 Pa, and an etching time of 140 s, a cylindrical window A is formed.

Modification 2 of the First Embodiment

The difference between the present modification and the first embodiment is that, in the (2) of the first step of the device fabrication step, by dry etching the p-type GaN cap layer to the p-type AlGaN barrier layer with high Al composition using ICP, with an etching depth of 135 nm, an etching gas of $Cl_2/BCl_3$, an etching electrode power of 600 W, a bias voltage of 0V, a pressure of 3 Pa, and an etching time of 100 s, a cylindrical window A is formed.

Modification 3 of the First Embodiment

The difference between the present modification and the first embodiment is the device fabrication step, as follows.

At the first step, by photo-lithographing a circular window on the p-type GaN cap layer, and etching the window to the p-type AlGaN barrier layer with high Al composition using RIE (reactive ion etching), a cylindrical window A is formed.

(1) firstly, coating a photoresist on a sample wafer by a photoresist coating machine at a rotation speed of 5000 revolutions/min, then baking the coated sample wafer in a baking box at 90° C. for 15 minutes. A desired window for etching is formed through photolithography and developing processes;

(2) dry etching the p-type GaN cap layer to the p-type AlGaN barrier layer with high Al composition using RIE, with an etching depth of 135 nm, an etching gas of $Cl_2/BCl_3$, an etching electrode power of 150 W, a bias voltage of 230V, a pressure of 10 mT, and an etching time of 240 s. A cylindrical window A with its bottom on the p-type AlGaN barrier layer is formed.

At the second step, an n-type electrode pattern is photo-lithographed on the back of the n-type SiC substrate, and an n-type ohmic contact metal is evaporated on the electrode pattern region by the electronic beam evaporation process, thereby forming an n-type electrode.

Sub-steps (1)-(3) of the present second step are substantially identical with that in the first embodiment, thereby omitting the detailed description of the same.

(4) putting the sample wafer into a rapid annealing oven, with the annealing oven being provided with nitrogen gas for 10 minutes, then high temperature annealing the sample wafer in nitrogen gas at the temperature of 1000° C. for 55 seconds, thereby forming the n-type electrode.

The third step of the present modification is substantially identical with that in the first embodiment, thereby omitting the detailed description of the same.

Modification 4 of the First Embodiment

The difference between the present modification and the Modification 3 of the first embodiment is that, in the sub-step (2) of the first step of the device fabrication step, by dry etching the p-type GaN cap layer to the p-type AlGaN barrier layer with high Al composition using RIE, with an etching depth of 135 nm, an etching gas of $Cl_2/BCl_3$, an etching electrode power of 320 W, a bias voltage of 410V, a pressure of 8 mT, and an etching time of 180 s, a cylindrical window A with its bottom on the p-type AlGaN barrier layer is formed.

Modification 5 of the First Embodiment

The difference between the present modification and the Modification 3 of the first embodiment is that, in the sub-step (2) of the first step of the device fabrication step, by dry etching the p-type GaN cap layer to the p-type AlGaN barrier layer with high Al composition using RIE, with an etching depth of 135 nm, an etching gas of $Cl_2/BCl_3$, an etching electrode power of 400 W, a bias voltage of 550V, a pressure of 5 mT, and an etching time of 100 s, a cylindrical window A with its bottom on the p-type AlGaN barrier layer is formed.

Second Embodiment

Hereinafter, a method for fabricating the UV LED device shown in FIG. 1F, having a sapphire substrate and a cylindrical window, is described with respect to FIGS. 3A-3C.

Figure 3A:
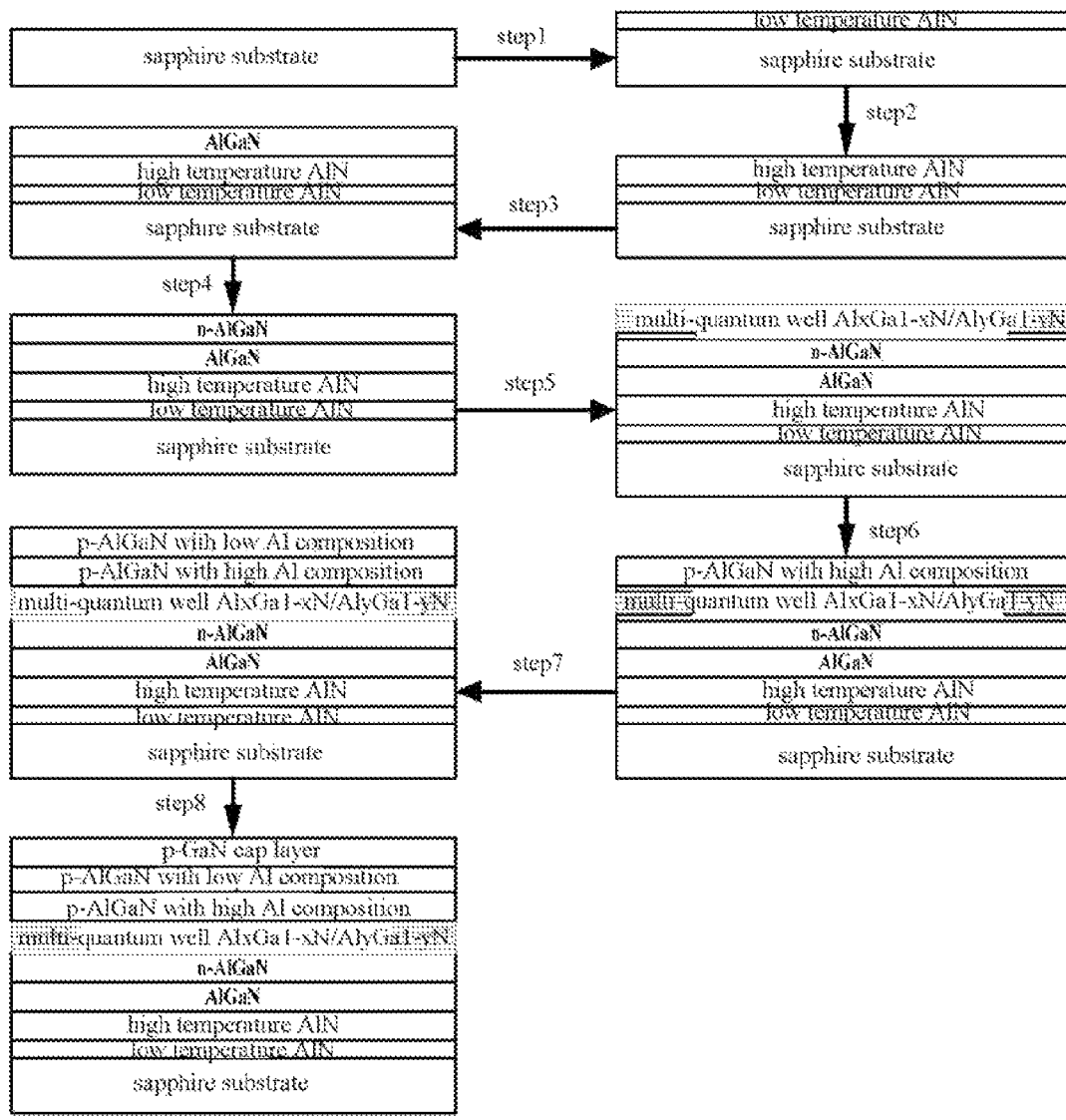
FIGS. 3A-3C are flowcharts illustrating a method for fabricating a UV LED device according to another embodiment of the present invention (sapphire substrate, cylindrical window)

First, a material growth step is shown is FIG. 3A:

At step 1, on the sapphire substrate, a low-temperature AlN nucleating layer is grown using a MOCVD process.

Lowering a temperature of the substrate to 600° C.; retaining a growing pressure of 50 Torr, a flow rate of 1500 sccm of hydrogen gas, a flow rate of 1500 sccm of ammonia gas; introducing an Al source at a flow rate of 28 μmol/min into a reaction chamber; and growing the low-temperature AlN nucleating layer with a thickness of 5 nm.

At step 2, on the low-temperature AlN nucleating layer, a high-temperature AlN nucleating layer is grown.

Raising a growing temperature to 1050° C.; retaining the growing pressure of 50 Torr, the flow rate of 1500 sccm of hydrogen gas, the flow rate of 1500 sccm of ammonia gas; introducing the Al source at a flow rate of 28 μmol/min into the reaction chamber; and growing the high-temperature AlN nucleating layer with a thickness of 200 nm.

At step 3, an AlGaN epitaxial layer is grown on the high-temperature AlN nucleating layer.

Maintaining the growing temperature at 1050° C.; retaining the growing pressure of 110 Torr, the flow rate of 1500 sccm of hydrogen gas, the flow rate of 1100 sccm of ammonia gas; introducing the Al source at a flow rate of 50 μmol/min and the gallium source at a flow rate of 80 μmol/min into the reaction chamber; and growing the undoped AlGaN epitaxial layer with a thickness of 1200 nm.

At step 4, a Si-doped n-type AlGaN barrier layer is grown on the AlGaN epitaxial layer.

Maintaining the growing temperature at 1050° C.; retaining the growing pressure of 110 Torr, the flow rate of 1500 sccm of hydrogen gas, the flow rate of 1500 sccm of ammonia gas; introducing the Al source at a flow rate of 60 μmol/min and the gallium source at a flow rate of 70 μmol/min and a Si source at a flow rate of 1-3 μmol/min into the reaction chamber; and growing the Si-doped AlGaN barrier layer with a thickness of 700 nm.

At step 5, a multi-quantum well $Al_xGa_{1-x}N/Al_yGa_{1-y}N$ (x<y) layer is grown on the n-type AlGaN barrier layer.

The present step 5 is substantially identical with that in the first embodiment, thereby omitting detailed description of the same.

At step 6, a p-type AlGaN barrier layer with high Al composition of 40%-60% is grown on the multi-quantum well $Al_xGa_{1-x}N/Al_yGa_{1-y}N$ layer.

Maintaining the growing temperature at 1000° C.; retaining the growing pressure of 100 Torr, the flow rate of 1500 sccm of hydrogen gas, the flow rate of 1500 sccm of ammonia gas; introducing the Al source at a flow rate of 110 μmol/min and the gallium source at a flow rate of 80 μmol/min and a Mg source at a flow rate of 3-5 μmol/min into the reaction chamber; and growing the p-type AlGaN barrier layer with high Al composition with a thickness of 65 nm.

At step 7, a p-type AlGaN barrier layer with low Al composition of 10%-25% is grown on the p-type barrier layer.

The present step 7 is substantially identical with that in the first embodiment, thereby omitting detailed description of the same.

At step 8, a p-type GaN cap layer is grown on the p-type AlGaN barrier layer with low Al composition.

The present step 8 is substantially identical with that in the first embodiment, thereby omitting detailed description of the same.

Figure 3B:
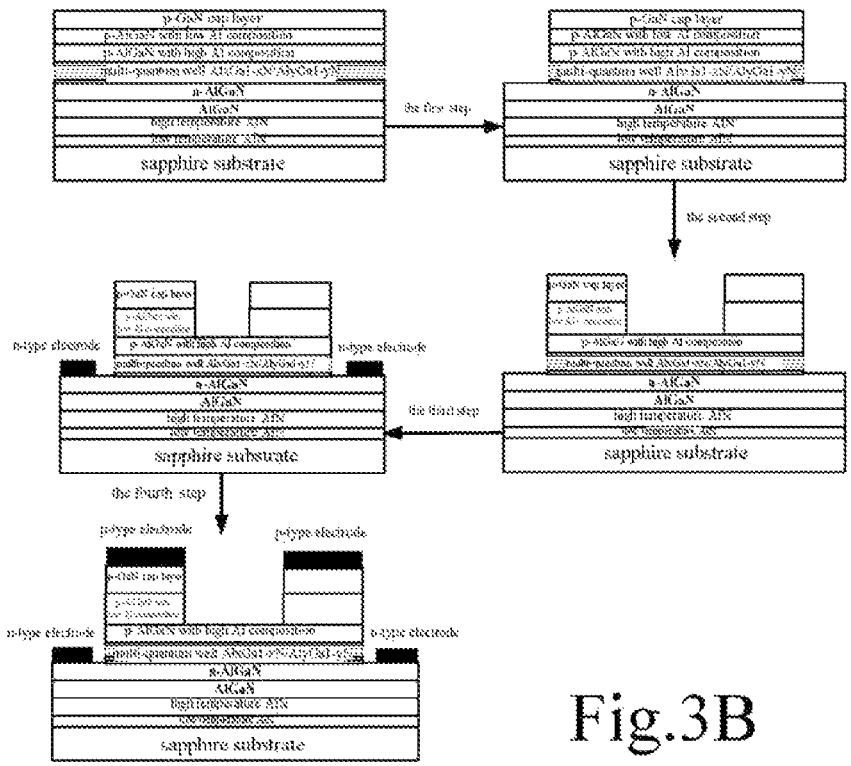
Figure 3C:
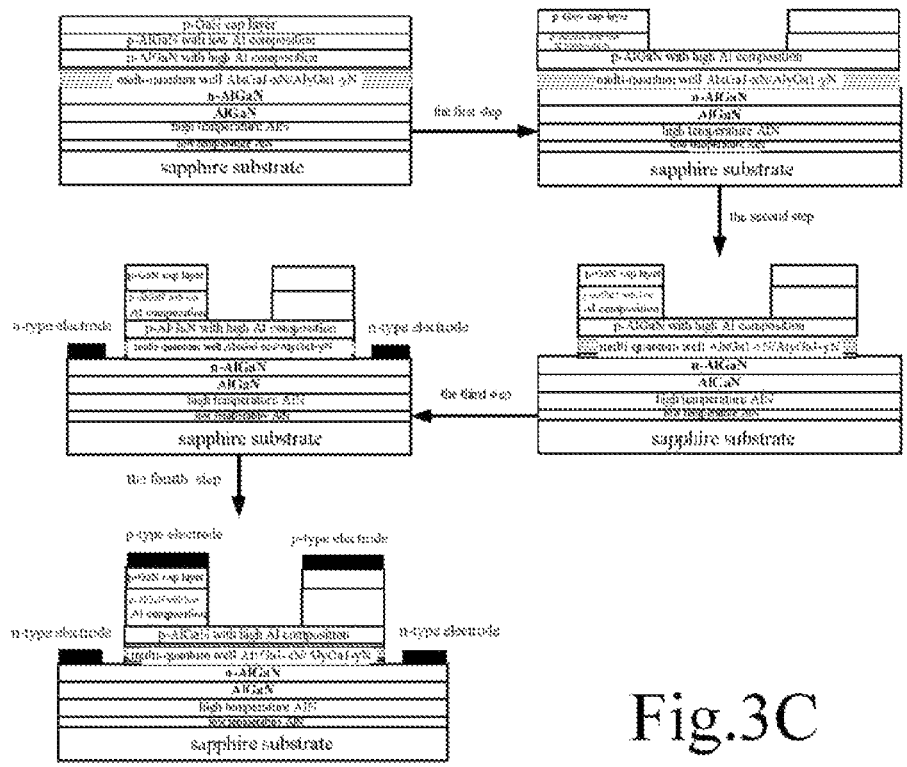

Next, a device fabrication step is shown in FIG. 3B.

At the first step, a mesa is etched from the p-type GaN cap layer to the n-type AlGaN layer using ICP or RIE process.

A $SiO_2$ layer with a thickness of about 300 nm, as an etching mask layer, is deposited with an electronic beam evaporation device. Since the etching rate for AlGaN material is relatively slower, adding this step is to form a double-layer mask pattern, including $SiO_2$ and photoresist, on the sample wafer, thereby facilitating the protection of unetched surface.

By coating the positive photoresist on the sample wafer at a rotation speed of 5000 revolutions/min and then baking the coated sample wafer in a baking box at 90° C. for 15 minutes, a desired pattern for etching is formed through photolithography and developing processes;

Forming the mesa using the ICP dry etching, with an etching electrode power of 550 W, a bias voltage of 110V, a pressure of 1.5 Pa, and an etching time of 400 s;

Removing the etched positive photoresist with acetone, then dipping the wafer into BOE for 1 minute so as to remove the $SiO_2$ mask, and cleaning the wafer with de-ionizing water and blowing dry nitrogen gas over the wafer, thereby removing etched mask.

At the second step, by photo-lithographing a circular window on the p-type GaN cap layer, and etching the window again to the p-type AlGaN barrier layer with high Al composition using the ICP, a cylindrical window A is formed.

(1) by coating the positive photoresist on a sample wafer at a rotation speed of 5000 revolutions/min, and then baking the coated sample wafer in a baking box at 90° C. for 15 minutes, a desired window for etching is formed through photolithography and developing processes;

(2) by dry etching the p-type GaN cap layer to the p-type AlGaN barrier layer with high Al composition using the ICP, with an etching gas of $Cl_2/BCl_3$, an etching depth of 135 nm, an etching electrode power of 240 W, a bias voltage of 80V, a pressure of 1 Pa, and an etching time of 180 s, a cylindrical window is formed.

At the third step, an n-type electrode pattern is photo-lithographed on the n-type AlGaN layer, and an n-type ohmic contact metal is evaporated on the electrode pattern region by an electronic beam evaporation process, thereby forming an n-type electrode.

In order for metal to be better stripped off, coating an adhesive on the sample wafer at a rotation speed of 8000 revolutions/min for 30 seconds, and baking the coated sample wafer in a baking box at 160° C. for 20 minutes; then coating the positive photoresist on the sample wafer at a rotation speed of 5000 revolutions/min, and then baking the coated sample wafer in a baking box at 80° C. for 10 minutes, thereby photo-lithographing the n-type electrode pattern;

Removing the thin photoresist layer undeveloped on the pattern region with a DQ-500 plasma photoresist removing machine in order to improve yield in the stripping off step, then depositing Ti/Al/Ti/Au four-layer metal with a VPC-1000 electronic beam evaporation device;

By dipping the deposited sample wafer into acetone solution for 40 minutes, ultrasonic processing the same, and then blowing dry nitrogen gas over the wafer, and putting the sample wafer into a rapid annealing oven, with the annealing oven being provided with nitrogen gas for 10 minutes, then high temperature annealing the sample wafer in nitrogen gas at the temperature of 870° C. for 40 seconds, the n-type electrode is formed.

At the fourth step, a p-type electrode pattern is photo-lithographed on the p-type GaN cap layer, and a p-type ohmic contact metal is evaporated on the electrode pattern region by an electronic beam evaporation process, thereby forming a p-type electrode.

First, coating an adhesive on the sample wafer at a rotation speed of 8000 revolutions/min for 30 seconds, and baking the coated sample wafer in a baking box at 160° C. for 20 minutes, then coating the positive photoresist on the sample wafer by a photoresist coating machine at a rotation speed of 5000 revolutions/min, then baking the coated sample wafer in a baking box at 80° C. for 10 minutes, thereby photolithographing the p-type electrode pattern;

Removing the thin photoresist layer undeveloped on the pattern region with a DQ-500 plasma photoresist removing machine, then evaporating Ni/Au two-layer metal, as the p-type electrode, into the p-type electrode pattern with the VPC-1100 electronic beam evaporation device;

Dipping the evaporated sample wafer into acetone solution for 20 minutes, ultrasonic processing the same, and then blowing dry nitrogen gas over the wafer; subsequently, putting the sample wafer into a rapid annealing oven, then high temperature annealing the sample wafer in air at the temperature of 560° C. for 10 minutes, thereby forming the p-type electrode. The fabrication of the device is completed.

Hereinabove, the second embodiment has been described, the modifications 1-5 of the second embodiment will be described below. Herein, detailed descriptions for the same steps are omitted.

Modification 1 of the Second Embodiment

The difference between the present modification (referring to FIG. 3B) and the second embodiment is, in the sub-step (2) of the second step of the device fabrication step, by dry etching the p-type GaN cap layer to the p-type AlGaN barrier layer with high Al composition using the ICP, with an etching depth of 135 nm, an etching gas of $Cl_2/BCl_3$, an etching electrode power of 450 W, a bias voltage of 60V, a pressure of 2 Pa, and an etching time of 140 s, a cylindrical window A is formed.

Modification 2 of the Second Embodiment

The difference between the present modification (referring to FIG. 3B) and the second embodiment is, in the sub-step (2) of the second step of the device fabrication step, by dry etching the p-type GaN cap layer to the p-type AlGaN barrier layer with high Al composition using the ICP, with an etching depth of 135 nm, an etching gas of $Cl_2/BCl_3$, an etching electrode power of 600 W, a bias voltage of 0V, a pressure of 3 Pa, and an etching time of 100 s, a cylindrical window A is formed.

Modification 3 of the Second Embodiment

The difference between the present modification (referring to FIG. 3C) and the second embodiment is the device fabrication step, as follows.

At the first step, by photo-lithographing a circular window on the p-type GaN cap layer, and etching the window to the p-type AlGaN barrier layer with high Al composition using the RIE again, a cylindrical window A is formed.

(1) by coating the photoresist on a sample wafer by a photoresist coating machine at a rotation speed of 5000 revolutions/min, and then baking the coated sample wafer in a baking box at 90° C. for 15 minutes, a desired window for etching is formed through photolithography and developing processes;

(2) by etching the p-type GaN cap layer to the p-type AlGaN barrier layer with high Al composition using the RIE process, with an etching depth of 135 nm, an etching gas of $Cl_2/BCl_3$, an etching electrode power of 150 W, a bias voltage of 230V, a pressure of 10 mT, and an etching time of 240 s, a cylindrical window with its bottom on the p-type AlGaN barrier layer is formed.

At the second step, a mesa is formed by etching the p-type GaN cap layer to the n-type AlGaN layer using the ICP or RIE.

A $SiO_2$ layer with a thickness of 300 nm, as an etching mask layer is deposited with the electronic beam evaporation device. Since the etching rate for AlGaN material is relatively slower, adding this step is to form a double-layer mask pattern, including $SiO_2$ and photoresist, on the sample wafer, facilitating the protection of un-etched surface;

Coating positive photoresist on the sample wafer at a rotation speed of 5000 revolutions/min, then baking the coated sample wafer in a baking box at 90° C. for 15 minutes, thereby forming a desired pattern for etching through photolithography and developing processes;

Forming a mesa using the ICP dry etching, with an etching electrode power of 550 W, a bias voltage of 110V, a pressure of 1.5 Pa, and an etching time of 400 s;

Removing the etched positive photoresist with acetone, then dipping the wafer into BOE for 1 minute so as to remove the $SiO_2$ mask, and cleaning the wafer with de-ionizing water and blowing dry nitrogen gas over the wafer, thereby removing etched mask.

Modification 4 of the Second Modification

The difference between the present modification and the Modification 3 of the first embodiment is, in the sub-step (2) of the first step of the device fabrication step, by dry etching the p-type GaN cap layer to the p-type AlGaN barrier layer with high Al composition using the RIE, with an etching depth of 135 nm, an etching gas of $Cl_2/BCl_3$, an etching electrode power of 320 W, a bias voltage of 410V, a pressure of 8 mT, and an etching time of 180 s, a cylindrical window with its bottom on the p-type AlGaN barrier layer is formed.

Modification 5 of the Second Embodiment

The difference between the present modification and the Modification 3 of the first embodiment is, in the sub-step (2) of the first step of the device fabrication step, by dry etching the p-type GaN cap layer to the p-type AlGaN barrier layer with high Al composition using the RIE, with an etching depth of 135 nm, an etching gas of $Cl_2/BCl_3$, an etching electrode power of 400 W, a bias voltage of 550V, a pressure of 5 mT, and an etching time of 100 s, a cylindrical window with its bottom on the p-type AlGaN barrier layer is formed.

Third Embodiment

Figure 4:
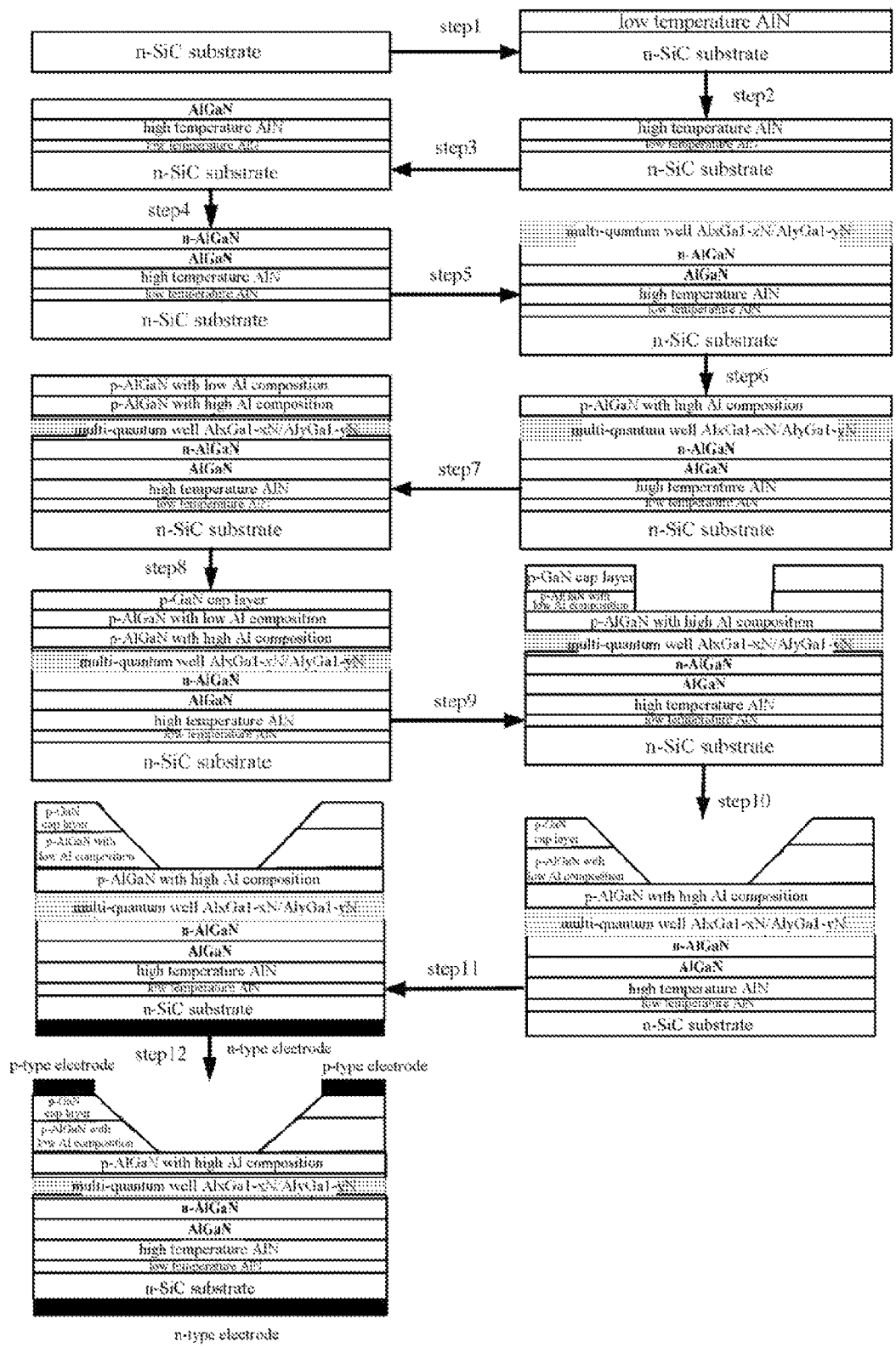
FIG. 4 is a flowchart illustrating a method for fabricating a UV LED device according to yet another embodiment of the present invention (SiC substrate, conical window)

Hereinafter, a method for fabricating the UV LED device shown in FIG. 1A, having a SiC substrate and a conic window, is described with respect to FIG. 4. On the SiC substrate 1, a cone-like window is made using the ICP dry etching and a wet etching, the steps are as follows.

At step 1, on the SiC substrate 1, a low-temperature AlN nucleating layer 2 is grown using the MOCVD process.

Lowering a temperature of the substrate to 600° C.; retaining a growing pressure of 50 Torr, a flow rate of 1500 sccm of hydrogen gas, a flow rate of 1500 sccm of ammonia gas; introducing an Al source at a flow rate of 28 μmol/min into a reaction chamber; and growing the low-temperature AlN nucleating layer with a thickness of 10 nm.

At step 2, on the low-temperature AlN nucleating layer 2, a high-temperature AlN nucleating layer 3 is grown.

Raising a growing temperature to 1050° C.; retaining the growing pressure of 50 Torr, the flow rate of 1500 sccm of hydrogen gas, the flow rate of 1500 sccm of ammonia gas; introducing the Al source at a flow rate of 28 μmol/min into the reaction chamber; and growing the high-temperature AlN nucleating layer with a thickness of 280 nm.

At step 3, an AlGaN epitaxial layer 4 is grown on the high-temperature AlN nucleating layer 3.

Maintaining the growing temperature at 1050° C.; retaining the growing pressure of 110 Torr, the flow rate of 1500 sccm of hydrogen gas, the flow rate of 1100 sccm of ammonia gas; introducing the Al source at a flow rate of 50 μmol/min and the gallium source at a flow rate of 80 μmol/min into the reaction chamber; and growing the undoped AlGaN epitaxial layer with a thickness of 1500 nm.

At step 4, a Si-doped n-type AlGaN barrier layer 5 is grown on the AlGaN epitaxial layer 4.

Maintaining the growing temperature at 1050° C.; retaining the growing pressure of 110 Torr, the flow rate of 1500 sccm of hydrogen gas, the flow rate of 1500 sccm of ammonia gas; introducing the Al source at a flow rate of 60 μmol/min and the gallium source at a flow rate of 70 μmol/min and a Si source at a flow rate of 1-3 μmol/min into the reaction chamber; and growing the Si-doped AlGaN barrier layer with a thickness of 800 nm.

At step 5, a multi-quantum well $Al_xGa_{1-x}N/Al_yGa_{1-y}N$ (x<y) layer 6 is grown on the n-type AlGaN barrier layer 5.

Maintaining the growing temperature at 1050° C.; retaining the growing pressure of 130 Torr, the flow rate of 1500 sccm of hydrogen gas, the flow rate of 1500 sccm of ammonia gas; introducing the Al source at a flow rate of 60 μmol/min and the gallium source at a flow rate of 80 μmol/min into the reaction chamber; and growing the $Al_xGa_{1-x}N$ barrier layer with a thickness of 2-7 nm. Then, Maintaining the growing temperature at 1050° C.; retaining the growing pressure of 70 Torr, the flow rate of 1500 sccm of hydrogen gas, the flow rate of 1500 sccm of ammonia gas; introducing the Al source at a flow rate of 80 μmol/min and the gallium source at a flow rate of 65 μmol/min into the reaction chamber; and growing the $Al_yGa_{1-y}N$ barrier layer with a thickness of 2-10 nm and the period of 3-5 of the quantum wells.

At step 6, a p-type AlGaN barrier layer 7 with high Al composition of 40%-60% is grown on the multi-quantum well $Al_xGa_{1-x}N/Al_yGa_{1-y}N$ layer 6.

Maintaining the growing temperature at 1000° C.; retaining the growing pressure of 100 Torr, the flow rate of 1500 sccm of hydrogen gas, the flow rate of 1500 sccm of ammonia gas; introducing the Al source at a flow rate of 110 μmol/min and the gallium source at a flow rate of 70 μmol/min and a Mg source at a flow rate of 3-5 μmol/min into the reaction chamber; and growing the p-type AlGaN barrier layer with high Al composition with a thickness of 65 nm.

At step 7, a p-type AlGaN barrier layer 8 with low Al composition of 10%-25% is grown on the p-type AlGaN barrier layer 7.

Maintaining the growing temperature at 1000° C.; retaining the growing pressure of 100 Torr, the flow rate of 1500 sccm of hydrogen gas, the flow rate of 1500 sccm of ammonia gas; introducing the Al source at a flow rate of 90 μmol/min and the gallium source at a flow rate of 130 μmol/min and the Mg source at a flow rate of 3-5 μmol/min into the reaction chamber; and growing the p-type AlGaN barrier layer with low Al composition with a thickness of 60 nm.

At step 8, a p-type GaN cap layer 9 is grown on the p-type AlGaN barrier layer 8 with low Al composition.

Maintaining the growing temperature at 950° C.; retaining the growing pressure of 70 Torr, the flow rate of 1500 sccm of hydrogen gas, the flow rate of 1500 sccm of ammonia gas; introducing the gallium source at a flow rate of 70 μmol/min and the Mg source at a flow rate of 3-5 μmol/min into the reaction chamber; and growing the p-type GaN cap layer with a thickness of 60 nm.

At step 9, photo-lithographing a circular window on the p-type GaN cap layer 9, and etching the window to the p-type AlGaN barrier layer 7 with high Al composition using the ICP.

(9a) photo-lithographing the window: by coating the positive photoresist on the sample wafer at a rotation speed of 5000 revolutions/min, and then baking the coated sample wafer in a baking box at 90° C. for 15 minutes, a desired window for etching is formed through photolithography and developing processes;

(9b) etching the window using the ICP: by dry etching the p-type GaN cap layer to the p-type AlGaN barrier layer with high Al composition using the ICP, with an etching depth of 140 nm, an etching gas of $Cl_2/BCl_3$, an etching electrode power of 200 W, a bias voltage of 100V, a pressure of 1 Pa, and an etching time of 200 s, a cylindrical window is formed.

At step 10, by wet etching the cylindrical window using a NaOH solution, a cone-like window 10 is formed.

By putting the twice-etched sample wafer into the NaOH solution at the temperature of 100° C. for wet etching for 4 minutes, the shape of the window is changed from the cylindrical to the cone-like shape, thereby the window of the whole device is increased.

At step 11, an n-type electrode pattern is photo-lithographed at the back of the n-type SiC substrate 1, and an n-type electrode is formed by evaporating an n-type ohmic contact metal on the electrode pattern using an electronic beam evaporation process.

(11a) photo-lithographing the n-type electrode pattern: in order for metal to be better stripped off, coating an adhesive on the sample wafer at a rotation speed of 8000 revolutions/min for 30 seconds, and baking the coated sample wafer in a baking box at 160° C. for 20 minutes; then coating positive photoresist on the sample wafer at a rotation speed of 5000 revolutions/min, then baking the coated sample wafer in a baking box at 80° C. for 10 minutes, thereby photolithographing the n-type electrode pattern;

(11b) processing base film: removing the thin photoresist layer undeveloped on the pattern region with the DQ-500 plasma photoresist removing machine in order to improve yield in the stripping off step;

(11c) evaporating an n-type electrode metal: depositing Ni/Au two-layer metal with the VPC-1000 electronic beam evaporation device;

(11d) stripping off the n-type metal and annealing: dipping the deposited sample wafer into acetone solution for 40 minutes, ultrasonic processing the same, and then blowing dry nitrogen gas over the wafer; putting the sample wafer into a rapid annealing oven, with the annealing oven being provided with nitrogen gas for about 10 minutes, then high temperature annealing the sample wafer in the nitrogen gas at temperature of 950° C. for 70 seconds, thereby forming the n-type electrode.

At step 12, a p-type electrode pattern is photo-lithographed on the p-type GaN cap layer 9, and a p-type ohmic contact metal is evaporated on the electrode pattern region using an electronic beam evaporation process, thereby forming the p-type electrode.

(12a) photo-lithographing the p-type electrode pattern: first, coating an adhesive on the sample wafer at a rotation speed of 8000 revolutions/min for 30 seconds, and baking the coated sample wafer in a baking box at 160° C. for 20 minutes, then coating the positive photoresist on the sample wafer at a rotation speed of 5000 revolutions/min, then baking the coated sample wafer in a baking box at 80° C. for 10 minutes, thereby photolithographing the p-type electrode pattern;

(12b) evaporating Ni/Au two-layer metal, as the p-type electrode, on the p-type electrode pattern with the VPC-1100 electronic beam evaporation device;

(12c) dipping the deposited sample wafer into acetone solution for 20 minutes, ultrasonic processing the same, and then blowing dry nitrogen gas over the wafer; putting the sample wafer into a rapid annealing oven filled with air, then high temperature annealing the sample wafer at the temperature of 560° C. for 10 minutes, thereby forming the p-type electrode. The fabrication of the device is completed.

Hereinabove the third embodiment has been described, the modifications 1-5 of the third embodiment will be explained below. Herein, detailed descriptions for the same steps are omitted.

Modification 1 of the Third Embodiment

Steps 1-8 and 11-12 in the present modification are substantially identical with that in the third embodiment, and the differences between them are:

In sub-step (9b) of the step 9, etching the window using the ICP: by dry etching the p-type GaN cap layer to the p-type AlGaN barrier layer with high Al composition using the ICP, with an etching depth of 140 nm, an etching gas of $Cl_2/BCl_3$, an etching electrode power of 400 W, a bias voltage of 50V, a pressure of 2 Pa, and an etching time of 150 s, a cylindrical window is formed.

In step 10, putting the twice-etched sample wafer into the NaOH solution at the temperature of 130° C. for 2 minutes, for wet etching, the shape of the window is changed from the cylindrical to the cone-like shape, thereby the window of the whole device is increased.

Modification 2 of the Third Embodiment

Steps 1-8 and 11-12 in present modification are substantially identical with that in the third embodiment, and the differences between them are:

In sub-step (9b) of the step 9, etching the window using the ICP: by dry etching the p-type GaN cap layer to the p-type AlGaN barrier layer with high Al composition using the ICP, with an etching depth of 140 nm, an etching gas of $Cl_2/BCl_3$, an etching electrode power of 600 W, a bias voltage of 0V, a pressure of 3 Pa, and an etching time of 100 s, a cylindrical window is formed.

In step 10, by putting the twice-etched sample wafer into the NaOH solution at the temperature of 150° C. for 1 minute, for wet etching, the shape of the window is changed from the cylindrical to the cone-like shape, thereby the window of the whole device is increased.

Modification 3 of the Third Embodiment

In the present modification, steps identical with that in the third embodiment are omitted for their descriptions. On the SiC substrate, a cone-like window is made using the RIE dry etching and wet etching, the steps are as follows:

Steps 1-8 are substantially identical with that in the third embodiment, the detailed descriptions of the same are omitted.

At step 9, photo-lithographing a circular window on the p-type GaN cap layer 9, and etching the window to the p-type AlGaN barrier layer 7 with high Al composition using the RIE.

(9a) by coating photoresist on the sample wafer at a rotation speed of 5000 revolutions/min, and then baking the coated sample wafer in a baking box at 90° C. for 15 minutes, a desired window for etching is formed through photolithography and developing processes;

(9b) by dry etching the p-type GaN cap layer to the p-type AlGaN barrier layer with high Al composition using the RIE, with an etching depth of 140 nm, an etching gas of $Cl_2/BCl_3$, an etching electrode power of 50 W, a bias voltage of 100V, a pressure of 10 mT, and an etching time of 200 s, a cylindrical window with its bottom on the p-type AlGaN barrier layer is formed.

At step 10, by putting the twice-etched sample wafer into the NaOH solution at the temperature of 100° C. for 4 minutes, for wet etching, the shape of the window is changed from the cylindrical to the cone-like shape, thereby the window of the whole device is increased.

Steps 11-12 are substantially identical with that in the third embodiment, and the detailed description of which are omitted.

Modification 4 of the Third Embodiment

In the present modification, steps 1-8 and 11-12 are identical with that in the third embodiment and the differences between them are:

In sub-step (9b) of the step 9, by dry etching the p-type GaN cap layer to the p-type AlGaN barrier layer with high Al composition using the RIE, with an etching depth of 140 nm, an etching gas of $Cl_2/BCl_3$, an etching electrode power of 300 W, a bias voltage of 400V, a pressure of 7 mT, and an etching time of 150 s, a cylindrical window is formed.

In step 10, by putting the twice-etched sample wafer into the NaOH solution at the temperature of 120° C. for 2 minutes, for wet etching, the shape of the window is changed from the cylindrical to the cone-like shape, thereby the window of the whole device is increased.

Modification 5 of the Third Embodiment

In the present modification, steps 1-8 and 11-12 are identical with that in the third embodiment and the differences between them are:

In sub-step (9b) of the step 9, by dry etching the p-type GaN cap layer to the p-type AlGaN barrier layer with high Al composition using the RIE, with an etching depth of 140 nm, an etching gas of $Cl_2/BCl_3$, an etching electrode power of 500 W, a bias voltage of 600V, a pressure of 5 mT, and an etching time of 100 s, a cylindrical window is formed.

In step 10, by putting the twice-etched sample wafer into the NaOH solution at the temperature of 150° C. for 1 minute, for wet etching, the shape of the window is changed from the cylindrical to the cone-like shape, thereby the window of the whole device is increased.

Fourth Embodiment

Figure 5:
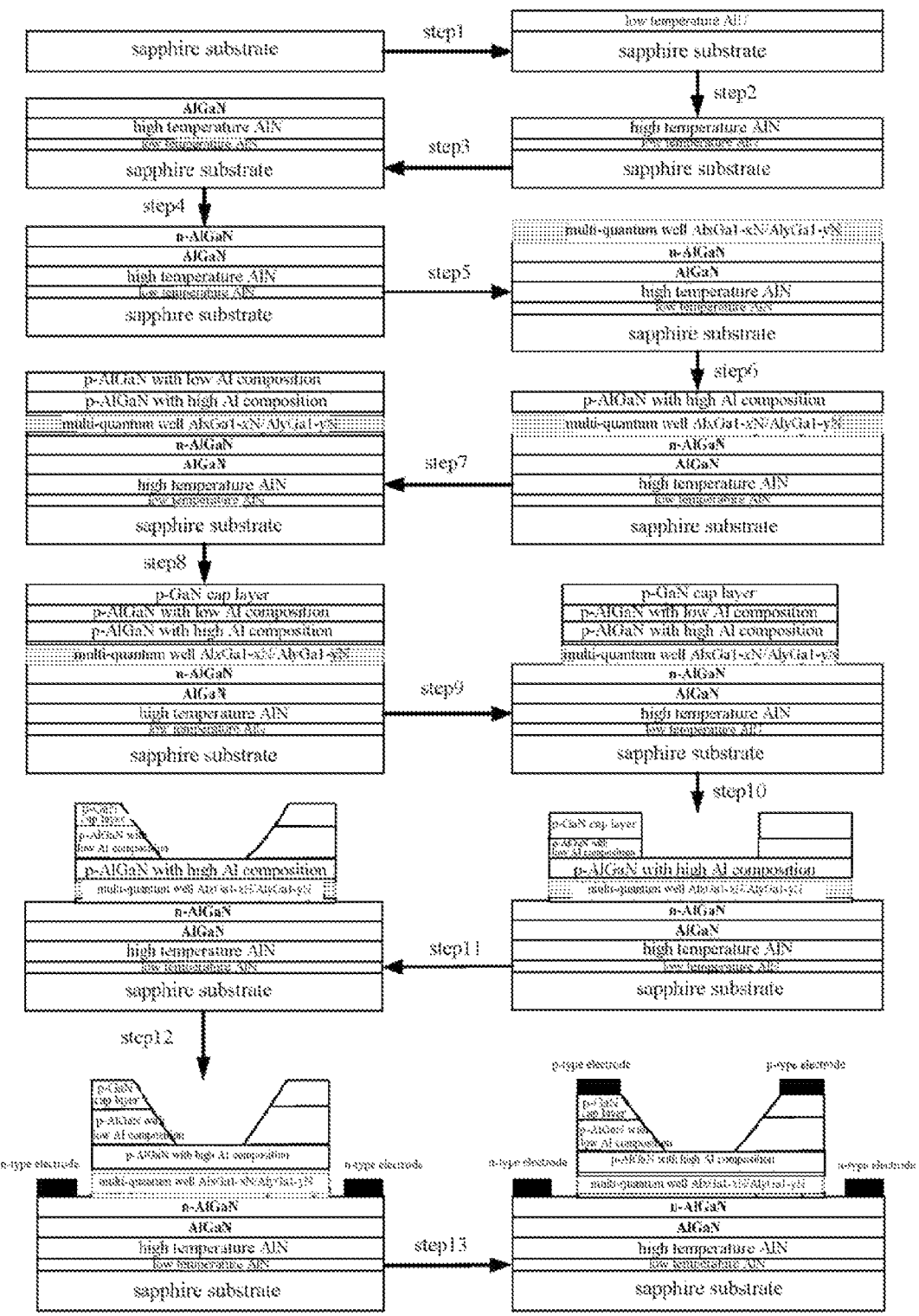
FIG. 5 is a flowchart illustrating a method for fabricating a UV LED device according to yet another embodiment of the present invention (sapphire substrate, conical window)

Hereinafter, a method for fabricating the UV LED device shown in FIG. 1B, having a sapphire substrate and a conic window, is described with respect to FIG. 5. On the sapphire substrate, a cone-like window is made using the ICP dry etching and wet etching, the steps are as follows.

At step 1, on the sapphire substrate 1, a low-temperature AlN nucleating layer 2 is grown using the MOCVD process.

The process and flow of the present step 1 are substantially identical with that of the step 1 in the third embodiment.

Steps 2-8 are substantially identical with steps 2-8 in the third embodiment.

At step 9, a mesa is formed by etching the p-type GaN cap layer 9 to the n-type AlGaN layer 5 using ICP or RIE process.

(9a) depositing $SiO_2$: Depositing a SiO2 layer with a thickness of 300 nm using the electronic beam evaporation device. Since the etching rate for AlGaN material is relatively slower, adding this step is to form a double-layer mask pattern, including $SiO_2$ and photoresist, on the sample wafer, facilitating the protection of un-etched surface.

(9b) photo-lithographing the mesa: by coating the positive photoresist on the sample wafer at a rotation speed of 5000 revolutions/min, then baking the coated sample wafer in a baking box at 90° C. for 15 minutes, a desired pattern for etching is formed through photolithography and developing processes;

(9c) ICP etching: a mesa is formed using the ICP dry etching, with an etching electrode power of 550 W, a bias voltage of 110V, a pressure of 1.5 Pa, and an etching time of 400 s;

(9d) removing etched mask: removing the etched positive photoresist with acetone, then dipping the wafer into BOE for 1 minute so as to remove the $SiO_2$ mask, cleaning the wafer with de-ionizing water and blowing dry nitrogen gas over the wafer.

At step 10, photo-lithographing a circular window on the p-type GaN Cap layer 9 and etching the window again to the p-type AlGaN barrier layer 7 with high Al composition using the ICP. The process and flow are substantially identical with that in step 9 of the third embodiment.

At step 11, by wet etching the cylindrical window using the NaOH solution, a cone-like window 10 is formed.

By putting the twice-etched sample wafer into the NaOH solution at the temperature of 80° C. for 2 minutes, for wet etching, the shape of the window is changed from the cylindrical to the cone-like shape, thereby the window of the whole device is increased.

At step 12, an n-type electrode pattern is photo-lithographed on the n-type AlGaN layer 5, and an n-type electrode is formed by evaporating an n-type ohmic contact metal on the electrode pattern using an electronic beam evaporation process.

(12a) in order for metal to be better stripped off, coating an adhesive on the sample wafer at a rotation speed of 8000 revolutions/min for 30 seconds, and baking the coated sample wafer in a baking box at 160° C. for 20 minutes, then coating the photoresist on the sample wafer at a rotation speed of 5000 revolutions/min, then baking the coated sample wafer in a baking box at 80° C. for 10 minutes, thereby photolithographing an n-type electrode pattern;

(12b) removing the thin photoresist layer undeveloped on the pattern region with the DQ-500 plasma photoresist removing machine in order to improve yield in the stripping off step;

(12c) depositing Ti/Al/Ti/Au four-layer metal, as the n-type electrode, with the VPC-1000 electronic beam evaporation device;

(12d) dipping the deposited sample wafer into acetone solution for 40 minutes, ultrasonic processing the same, and then blowing dry nitrogen gas over the wafer; putting the sample wafer into a rapid annealing oven, with the annealing oven being provided with nitrogen gas for 10 minutes, then high temperature annealing the sample wafer in nitrogen gas at the temperature of 870° C. for 40 seconds, thereby forming the n-type electrode.

At step 13, a p-type electrode pattern is photo-lithographed on the p-type GaN cap layer 9, and an n-type ohmic contact metal is evaporated on the electrode pattern region using an electronic beam evaporation process, thereby forming the p-type electrode.

(13a) first, coating an adhesive on the sample wafer at a rotation speed of 8000 revolutions/min for 30 seconds, and baking the coated sample wafer in a baking box at 160° C. for 20 minutes, then coating the positive photoresist on the sample wafer at a rotation speed of 5000 revolutions/min, then baking the coated sample wafer in a baking box at 80° C. for 10 minutes, thereby obtaining the p-type electrode pattern through photolithography process;

(13b) evaporating Ni/Au two-layer metal, as the p-type electrode, with the VPC-1100 electronic beam evaporation device;

(13c) dipping the deposited sample wafer into acetone solution for 20 minutes, ultrasonic processing the same, and then blowing dry nitrogen gas over the wafer; putting the sample wafer into a rapid annealing oven filled with air, then high temperature annealing the sample wafer at the temperature of 560° C. for 10 minutes, thereby forming the p-type electrode. The fabrication of the device is completed.

Hereinabove the fourth embodiment has been described, the modifications 1-5 of the fourth embodiment will be described below. Herein, detailed descriptions for the same steps are omitted.

Modification 1 of the Fourth Embodiment

Steps 1-9 and 12-13 in the present modification are substantially identical with that in the fourth embodiment, and the differences between them are:

In the sub-step 10b of the step 10, etching the window using the ICP: by dry etching the p-type GaN cap layer to the p-type AlGaN barrier layer with high Al composition using the ICP, with an etching depth of 140 nm, an etching gas of $Cl_2/BCl_3$, an etching electrode power of 400 W, a bias voltage of 50V, a pressure of 2 Pa, and an etching time of 150 s, a cylindrical window is formed.

In step 11, by putting the twice-etched sample wafer into the NaOH solution at the temperature of 100° C. for 1 minute, for wet etching, the shape of the window is changed from the cylindrical to the cone-like shape, thereby the window of the whole device is increased.

Modification 2 of the Fourth Embodiment

Steps 1-9 and 12-13 in the present modification are substantially identical with that in the fourth embodiment, and the differences between them are:

In sub-step 10b of the step 10, etching the window using the ICP: by dry etching the p-type GaN cap layer to the p-type AlGaN barrier layer with high Al composition using the ICP, with an etching depth of 140 nm, an etching gas of $Cl_2/BCl_3$, an etching electrode power of 600 W, a bias voltage of 0V, a pressure of 3 Pa, and an etching time of 100 s, a cylindrical window A is formed.

In step 11, by putting the twice-etched sample wafer into the NaOH solution at the temperature of 120° C. for 0.5 minute, for wet etching, the shape of the window is changed from the cylindrical to the cone-like shape, thereby the window of the whole device is increased.

Modification 3 of the Fourth Embodiment

In the present modification, steps identical with that in the fourth embodiment are omitted for their descriptions.

On the sapphire substrate, a cone-like window is made using the RIE dry etching and wet etching, the steps are as follows:

At step 1, a low-temperature AlN nucleating layer 2 is grown on the sapphire substrate using the MOCVD process.

The process and flow of the present step 1 are substantially identical with that in step 1 in the Modification 3.

Steps 2-9 are substantially identical with steps 2-9 in the fourth embodiment.

At step 10, photo-lithographing a circular window on the p-type GaN cap layer 9, and etching the window again to the p-type AlGaN barrier layer 7 with high Al composition using the RIE.

(10a) by coating the photoresist on the sample wafer at a rotation speed of 5000 revolutions/min, then baking the coated sample wafer in a baking box at 90° C. for 15 minutes, a desired window for etching is formed through photolithography and developing processes;

(10b) by dry etching the p-type GaN cap layer to the p-type AlGaN barrier layer with high Al composition using the RIE, with an etching depth of 140 nm, an etching gas of $Cl_2/BCl_3$, an etching electrode power of 50 W, a bias voltage of 100V, a pressure of 10 mT, and an etching time of 200 s, a cylindrical window with its bottom on the p-type AlGaN barrier layer is formed.

At step 11, by wet etching the cylindrical window using the NaOH solution, a cone-like window 10 is formed.

By putting the twice-etched sample wafer into the NaOH solution at the temperature of 80° C. for 2 minutes, for wet etching, the shape of the window is changed from the cylindrical to the cone-like shape, thereby the window of the whole device is increased.

Steps 12-13 are substantially identical with steps 12-13 in the fourth embodiment.

Modification 4 of the Fourth Embodiment

In the present modification, steps 1-9 and 12-13 are identical with that in Modification 3 of the fourth embodiment and the differences between them are:

In sub-step 10b of the step, by dry etching the p-type GaN cap layer to the p-type AlGaN barrier layer with high Al composition using the RIE, with an etching depth of 140 nm, an etching gas of $Cl_2/BCl_3$, an etching electrode power of 300 W, a bias voltage of 400V, a pressure of 7 mT, and an etching time of 150 s, a cylindrical window is formed.

In step 11, by putting the twice-etched sample wafer into the NaOH solution at the temperature of 100° C. for 1 minute, for wet etching, the shape of the window is changed from the cylindrical to the cone-like shape, thereby the window of the whole device is increased.

Modification 5 of the Fourth Embodiment

In the present modification, steps 1-9 and 12-13 are identical with those in Modification 3 of the fourth embodiment and the differences between them are:

In sub-step 10b of the step 10, by dry etching the p-type GaN cap layer to the p-type AlGaN barrier layer with high Al composition using the RIE, with an etching depth of 140 nm, an etching gas of $Cl_2/BCl_3$, an etching electrode power of 500 W, a bias voltage of 600V, a pressure of 5 mT, and an etching time of 100 s, a cylindrical window is formed.

In step 11, by putting the twice-etched sample wafer into the NaOH solution at the temperature of 120° C. for 0.5 minute, for wet etching, the shape of the window is changed from the cylindrical to the cone-like shape, thereby the window of the whole device is increased.

Fifth Embodiment

Hereinafter, a method for fabricating the UV LED device shown in FIG. 1C, having a SiC substrate and a semi-sphere window, is described with respect to FIGS. 6A-6C, the method includes three steps of material growth, window fabrication and electrode fabrication.

Figure 6A:
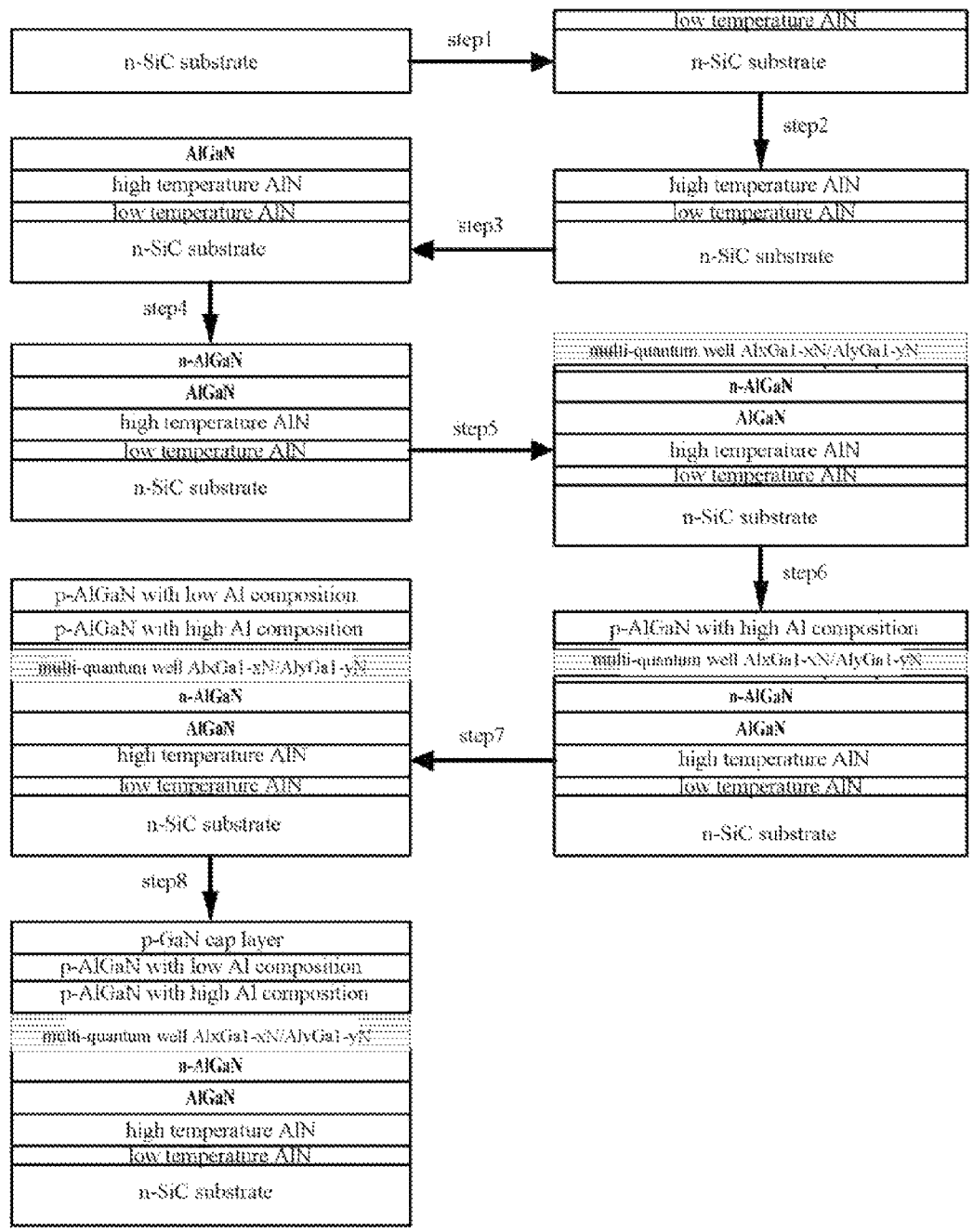
FIGS. 6A-6C are flowcharts illustrating a method for fabricating a UV LED device according to still another embodiment of the present invention (SiC substrate, semi-sphere window).

First, a material growth step is shown in FIG. 6A:

At step 1, on the SiC substrate, a low-temperature AlN nucleating layer is grown using the MOCVD process.

Lowering a temperature of the substrate to 600° C.; retaining a growing pressure of 50 Torr, a flow rate of 1500 sccm of hydrogen gas, a flow rate of 1500 sccm of ammonia gas; introducing an Al source at a flow rate of 23 μmol/min into a reaction chamber; and growing the low-temperature AlN nucleating layer with a thickness of 7 nm.

At step 2, on the low-temperature AlN nucleating layer, a high-temperature AlN nucleating layer is grown.

Raising a growing temperature to 1050° C.; retaining the growing pressure of 50 Torr, the flow rate of 1500 sccm of hydrogen gas, the flow rate of 1500 sccm of ammonia gas; introducing the Al source at a flow rate of 26 μmol/min into the reaction chamber; and growing the high-temperature AlN nucleating layer with a thickness of 50 nm.

At step 3, an AlGaN epitaxial layer is grown on the high-temperature AlN nucleating layer.

Maintaining the growing temperature at 1050° C.; retaining the growing pressure of 110 Torr, the flow rate of 1500 sccm of hydrogen gas, the flow rate of 1100 sccm of ammonia gas; introducing the Al source at a flow rate of 42 μmol/min and the gallium source at a flow rate of 75 μmol/min into the reaction chamber; and growing the undoped AlGaN epitaxial layer with a thickness of 800 nm.

At step 4, a Si-doped n-type AlGaN barrier layer is grown on the AlGaN epitaxial layer.

Maintaining the growing temperature at 1050° C.; retaining the growing pressure of 110 Torr, the flow rate of 1500 sccm of hydrogen gas, the flow rate of 1500 sccm of ammonia gas; introducing the Al source at a flow rate of 55 μmol/min and the gallium source at a flow rate of 60 μmol/min and a Si source at a flow rate of 2-4 μmol/min into the reaction chamber; and growing the Si-doped AlGaN barrier layer with a thickness of 500 nm.

At step 5, a multi-quantum well $Al_xGa_{1-x}N/Al_yGa_{1-y}N$ (x<y) layer is grown on the n-type AlGaN barrier layer.

Maintaining the growing temperature at 1050° C.; retaining the growing pressure of 120 Torr, the flow rate of 1500 sccm of hydrogen gas, the flow rate of 1500 sccm of ammonia gas; introducing the Al source at a flow rate of 65 μmol/min and the gallium source at a flow rate of 80 μmol/min into the reaction chamber; and growing the $Al_xGa_{1-x}N$ barrier layer with a thickness of 2-7 nm. Then, Maintaining the growing temperature at 1050° C.; retaining the growing pressure of 70 Torr, the flow rate of 1500 sccm of hydrogen gas, the flow rate of 1500 sccm of ammonia gas; introducing the Al source at a flow rate of 80 μmol/min and the gallium source at a flow rate of 65 μmol/min into the reaction chamber; and growing the $Al_yGa_{1-y}N$ barrier layer with a thickness of 2-10 nm and the period of 3-5 of the quantum wells.

At step 6, a p-type AlGaN barrier layer with high Al composition of 40%-60% is grown on the multi-quantum well $Al_xGa_{1-x}N/Al_yGa_{1-y}N$ layer.

Maintaining the growing temperature at 1000° C.; retaining the growing pressure of 100 Torr, the flow rate of 1500 sccm of hydrogen gas, the flow rate of 1500 sccm of ammonia gas; introducing the Al source at a flow rate of 110 μmol/min and the gallium source at a flow rate of 80 μmol/min and a Mg source at a flow rate of 3-5 μmol/min into the reaction chamber; and growing the p-type AlGaN barrier layer with high Al composition with a thickness of 65 nm.

At step 7, a p-type AlGaN barrier layer with low Al composition of 10%-25% is grown on the p-type barrier layer.

Maintaining the growing temperature at 1000° C.; retaining the growing pressure of 100 Torr, the flow rate of 1500 sccm of hydrogen gas, the flow rate of 1500 sccm of ammonia gas; introducing the Al source at a flow rate of 80 μmol/min and the gallium source at a flow rate of 120 μmol/min and the Mg source at a flow rate of 3-5 μmol/min into the reaction chamber; and growing the p-type AlGaN barrier layer with low Al composition with a thickness of 60 nm.

At step 8, a p-type GaN cap layer is grown on the p-type AlGaN barrier layer with low Al composition.

Maintaining the growing temperature at 950° C.; retaining the growing pressure of 70 Torr, the flow rate of 1500 sccm of hydrogen gas, the flow rate of 1500 sccm of ammonia gas; introducing the gallium source at a flow rate of 70 μmol/min and the Mg source at a flow rate of 3-5 μmol/min into the reaction chamber; and growing the p-type GaN cap layer with a thickness of 60 nm.

Figure 6B:
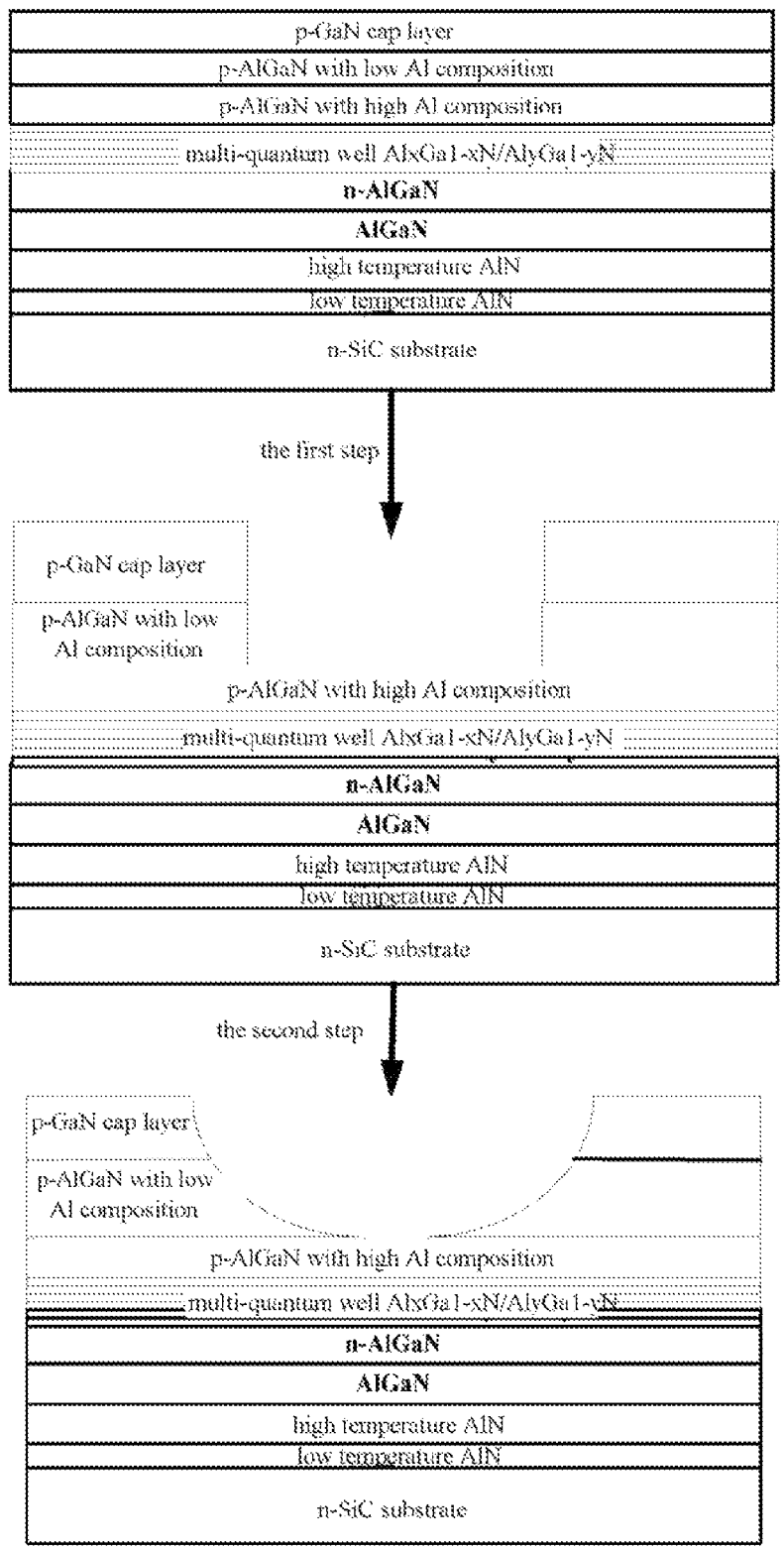

Next, a window fabrication step is shown in FIG. 6B.

At the first step, by photo-lithographing a circular window on the p-type GaN cap layer, and etching the window to a half of the depth of the p-type AlGaN barrier layer with low Al composition using the ICP, a cylindrical window is formed.

(1) by coating the positive photoresist on the sample wafer at a rotation speed of 5000 revolutions/minute, then baking the coated sample wafer in a baking box at a temperature of 90° C. for 15 minutes, a desired window for etching is formed through photolithography and etching processes;

(2) by dry etching the p-type GaN cap layer to the p-type AlGaN barrier layer with low Al composition using the ICP, with an etching gas of $Cl_2/BCl_3$, an etching depth of 90 nm, an etching electrode power of 180 W, a bias voltage of 150V, a pressure of 1 Pa, and an etching time of 230 s, a cylindrical window is formed.

At the second step, by a wet etching process with the aid of UV light, a substantially semi-sphere window W is formed.

(1) photo-lithographing a mask pattern for wet etching on the n-type AlGaN mesa and the p-type GaN cap layer, and evaporating a metal mask layer Ti for wet etching on the mask pattern region by an electronic beam evaporation process;

(2) putting the sample wafer into a KOH solution at a temperature of 70° C. for 3 minutes, for pre-processing the wafer before the wet etching;

(3) wet etching the sample wafer with the aid of UV light using the KOH electrolyte. The processing parameters for the wet etching are: a He—Cd laser irradiation at 325 nm, a bias voltage of −2V, an etching time of 15 minutes, thereby forming a semi-sphere window;

(4) putting the sample wafer into an HF solution with a ratio of 1:10, for rinsing off the metal mask layer Ti.

Figure 6C:
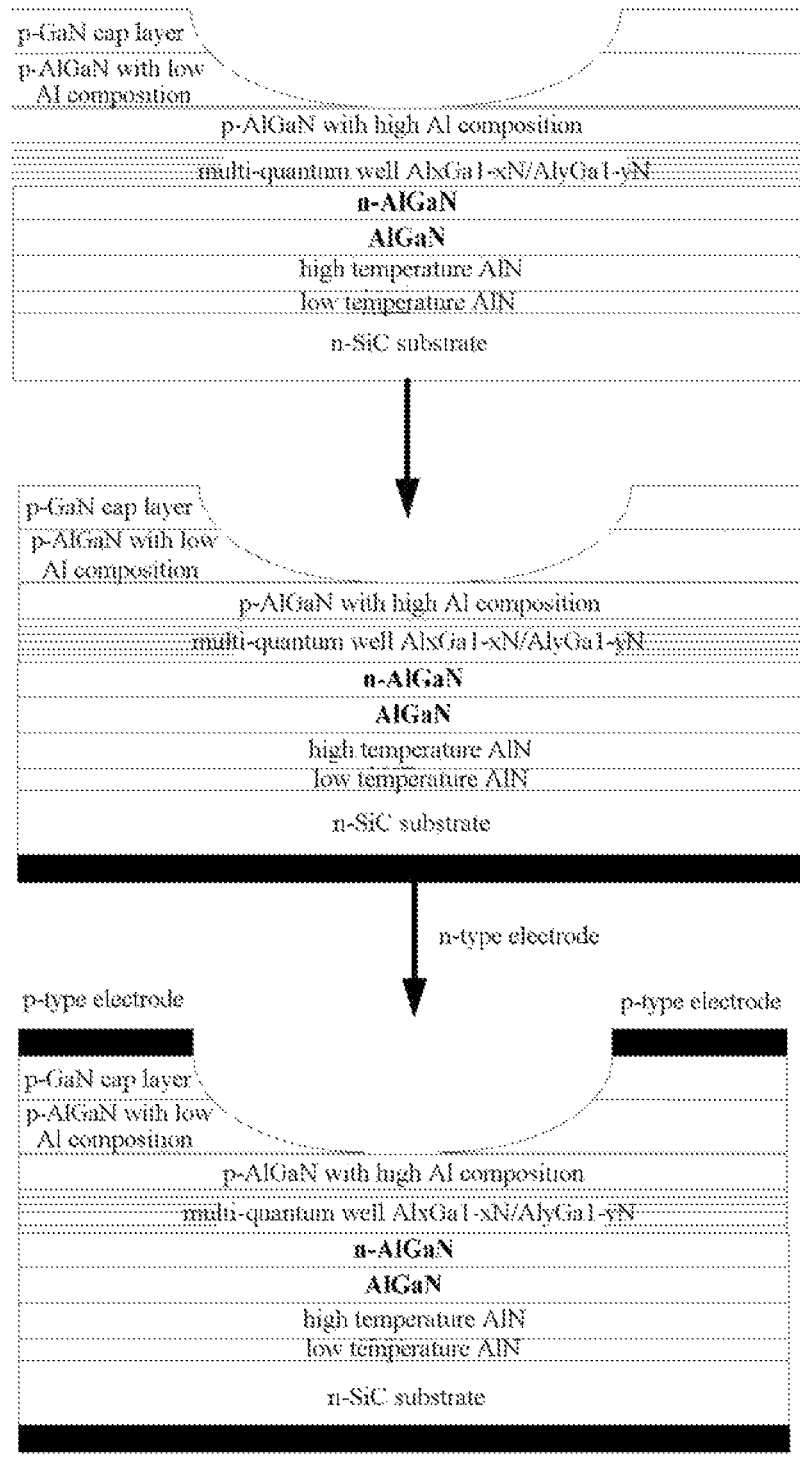

Then, an electrode fabrication step is illustrated in FIG. 6C.

1) an n-type electrode pattern is photo-lithographed on the back of the n-type SiC substrate, and an n-type ohmic contact metal is evaporated on the electrode pattern region by an electronic beam evaporation process, thereby forming an n-type electrode.

In order for metal to be better stripped off, coating an adhesive on the sample wafer at a rotation speed of 8000 revolutions/min for 30 seconds, and baking the coated sample wafer in a baking box at 160° C. for 20 minutes, then coating the positive photoresist on the sample wafer at a rotation speed of 5000 revolutions/min, then baking the coated sample wafer in a baking box at 80° C. for 10 minutes, thereby obtaining an n-type electrode pattern through photolithography process;

Removing the thin photoresist layer undeveloped on the pattern region with the DQ-500 plasma photoresist removing machine in order to improve yield in the stripping off step, then depositing Ni/Au two-layer metal with the VPC-1000 electronic beam evaporation device;

Dipping the deposited sample wafer into acetone solution for 40 minutes, ultrasonic processing the same, and then blowing dry nitrogen gas over the wafer; Putting the sample wafer into a rapid annealing oven, with the annealing oven being provided with nitrogen gas for 10 minutes, then high temperature annealing the sample wafer in nitrogen gas at the temperature of 1000° C. for 60 seconds, thereby forming the n-type electrode.

2) a p-type electrode pattern is photo-lithographed on the p-type GaN cap layer, and a p-type ohmic contact metal is evaporated on the electrode pattern region using an electronic beam evaporation process, thereby forming a p-type electrode.

First, coating an adhesive on the sample wafer at a rotation speed of 8000 revolutions/min for 30 seconds, and baking the coated sample wafer in a baking box at 160° C. for 20 minutes, then coating the positive photoresist on the sample wafer by a photoresist coating machine at a rotation speed of 5000 revolutions/min, then baking the coated sample wafer in a baking box at 80° C. for 10 minutes, thereby obtaining the p-type electrode pattern through photolithography process;

Second, removing the thin photoresist layer undeveloped on the pattern region with a DQ-500 plasma photoresist removing machine, then evaporating Ni/Au two-layer metal, as the p-type electrode, in the p-type electrode pattern with a VPC-1100 electronic beam evaporation device;

Finally, dipping the evaporated sample wafer into acetone solution for 20 minutes, ultrasonic processing the same, and then blowing dry nitrogen gas over the wafer; subsequently, putting the sample wafer into a rapid annealing oven filled with air, then high temperature annealing the sample wafer in air at the temperature of 600° C. for 10 minutes, thereby forming the p-type electrode. The fabrication of the device is completed.

Hereinabove the fifth embodiment has been described, the modifications 1-5 of the fifth embodiment will be described below. Herein, detailed descriptions for the same steps are omitted.

Modification 1 of the Fifth Embodiment

The differences between the present modification and the fifth embodiment are as follows:

in the sub-step (2) of the first step of the device fabrication step, by dry etching the p-type GaN cap layer to the p-type AlGaN barrier layer with low Al composition using ICP, with an etching depth of 90 nm, an etching gas of $Cl_2/BCl_3$, an etching electrode power of 450 W, a bias voltage of 90V, a pressure of 2 Pa, and an etching time of 160 s, the cylindrical window is formed.

In the sub-step (3) of the second step of the device fabrication step, wet etching the sample wafer with the aid of UV light using the KOH electrolyte, the processing parameters for the wet etching are: a He—Cd laser irradiation at 325 nm, a bias voltage of −3V, an etching time of 12 minutes, thereby forming the substantially semi-sphere window.

3. Electrode fabrication step: the step is identical with that in the fifth embodiment.

Modification 2 of the Fifth Embodiment

The differences between the present modification and the fifth embodiment are as follows:

in the sub-step (2) of the first step of the device fabrication step, by dry etching the p-type GaN cap layer to the p-type AlGaN barrier layer with low Al composition using ICP, with an etching depth of 90 nm, an etching gas of $Cl_2/BCl_3$, an etching electrode power of 600 W, a bias voltage of 0V, a pressure of 3 Pa, and an etching time of 100 s, the cylindrical window is formed.

In the sub-step (3) of the second step of the device fabrication step, wet etching the sample wafer with the aid of UV light using the KOH electrolyte, the processing parameters for the wet etching are: a He—Cd laser irradiation at 325 nm, a bias voltage of −4V, an etching time of 10 minutes, thereby forming the substantially semi-sphere window.

3. Electrode fabrication step: the step is identical with that in the fifth embodiment.

Modification 3 of the Fifth Embodiment

The differences between the present modification and the fifth embodiment are in the device fabrication step.

At the first step, by photo-lithographing a circular window on the p-type GaN cap layer, and etching the window to a half of the depth of the p-type AlGaN barrier layer with low Al composition using the RIE, the cylindrical window is formed.

(1) by coating the photoresist on the sample wafer at a rotation speed of 5000 revolutions/minute, then baking the coated sample wafer in a baking box at a temperature of 90° C. for 15 minutes, a desired window for etching is formed through photolithography and etching processes;

(2) by dry etching the p-type GaN cap layer to the p-type AlGaN barrier layer with low Al composition using the RIE, with an etching gas of $Cl_2/BCl_3$, an etching depth of 90 nm, an etching electrode power of 80 W, a bias voltage of 210V, a pressure of 10 mT, and an etching time of 210 s, the cylindrical window is formed.

At the second step, by a wet etching process with the aid of UV light, a substantially semi-sphere window W is formed.

(1) photo-lithographing a mask pattern for wet etching on the n-type AlGaN mesa and the p-type GaN cap layer, and evaporating a metal mask layer Ti for wet etching on the mask pattern region by an electronic beam evaporation process;

(2) putting the sample wafer into a KOH solution at a temperature of 80° C. for 3 minutes, for pre-processing the wafer before the wet etching;

(3) wet etching the sample wafer with the aid of UV light using the KOH electrolyte. The processing parameters for the wet etching are: a He—Cd laser irradiation at 325 nm, a bias voltage of −4V, an etching time of 13 minutes, thereby forming the substantially semi-sphere window;

(4) putting the sample wafer into an HF solution with a ratio of 1:10, for rinsing off the metal mask layer Ti.

Modification 4 of the Fifth Embodiment

The differences between the present modification and the Modification 3 of the fifth embodiment are as follows:

in the sub-step (2) of the first step of the device fabrication step, by dry etching the p-type GaN cap layer to the p-type AlGaN barrier layer with low Al composition using RIE, with an etching depth of 90 nm, an etching gas of $Cl_2/BCl_3$, an etching electrode power of 350 W, a bias voltage of 485V, a pressure of 7 mT, and an etching time of 155 s, the cylindrical window is formed.

In the sub-step (3) of the second step of the device fabrication step, wet etching the sample wafer with the aid of UV light using the KOH electrolyte, the processing parameters for the wet etching are: a He—Cd laser irradiation at 325 nm, a bias voltage of −5V, an etching time of 10 minutes, thereby forming the substantially semi-sphere window.

Modification 5 of the Fifth Embodiment

The differences between the present modification and the Modification 3 of the fifth embodiment are as follows:

in the sub-step (2) of the first step of the device fabrication step, by dry etching the p-type GaN cap layer to the p-type AlGaN barrier layer with low Al composition using RIE, with an etching depth of 90 nm, an etching gas of $Cl_2/BCl_3$, an etching electrode power of 400 W, a bias voltage of 620V, a pressure of 5 mT, and an etching time of 80 s, the cylindrical window is formed.

In the sub-step (3) of the second step of the device fabrication step, wet etching the sample wafer with the aid of UV light using the KOH electrolyte, the processing parameters for the wet etching are: a He—Cd laser irradiation at 325 nm, a bias voltage of −6V, an etching time of 8 minutes, thereby forming the substantially semi-sphere window.

Sixth Embodiment

Hereinafter, a method for fabricating the UV LED device shown in FIG. 1D, having a sapphire substrate and a semi-sphere window, is described with respect to FIGS. 7A-7C, the method includes three steps of material growth, window fabrication and electrode fabrication.

Figure 7A:
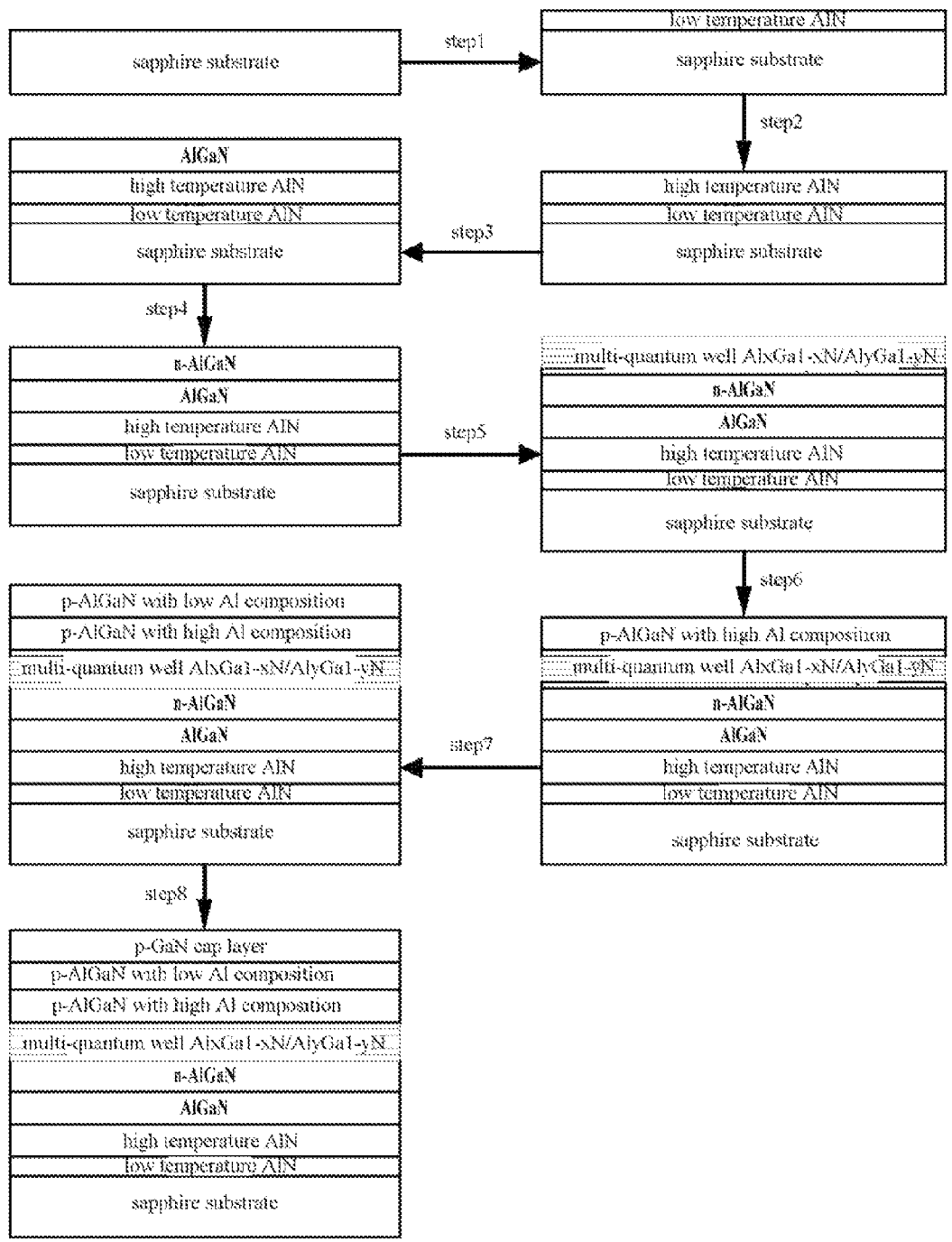
FIGS. 7A-7C are flowcharts illustrating a method for fabricating a UV LED device according to still another embodiment of the present invention (sapphire substrate, semi-sphere window).

First, the material growth step is shown in FIG. 7A:

1. Referring to FIG. 2, the material growth step is as follows:

At step 1, on the sapphire substrate, a low-temperature AlN nucleating layer is grown using the MOCVD process.

Lowering a temperature of the substrate to 600° C.; retaining a growing pressure of 50 Torr, a flow rate of 1500 sccm of hydrogen gas, a flow rate of 1500 sccm of ammonia gas; introducing an Al source at a flow rate of 23 μmol/min into a reaction chamber; and growing the low-temperature AlN nucleating layer with a thickness of 7 nm.

At step 2, on the low-temperature AlN nucleating layer, a high-temperature AlN nucleating layer is grown.

Raising a growing temperature to 1050° C.; retaining the growing pressure of 50 Torr, the flow rate of 1500 sccm of hydrogen gas, the flow rate of 1500 sccm of ammonia gas; introducing the Al source at a flow rate of 26 μmol/min into the reaction chamber; and growing the high-temperature AlN nucleating layer with a thickness of 180 nm.

At step 3, an AlGaN epitaxial layer is grown on the high-temperature AlN nucleating layer.

Maintaining the growing temperature at 1050° C.; retaining the growing pressure of 110 Torr, the flow rate of 1500 sccm of hydrogen gas, the flow rate of 1500 sccm of ammonia gas; introducing the Al source at a flow rate of 42 μmol/min and the gallium source at a flow rate of 75 μmol/min into the reaction chamber; and growing the undoped AlGaN epitaxial layer with a thickness of 1300 nm.

At step 4, a Si-doped n-type AlGaN barrier layer is grown on the AlGaN epitaxial layer.

Maintaining the growing temperature at 1050° C.; retaining the growing pressure of 110 Torr, the flow rate of 1500 sccm of hydrogen gas, the flow rate of 1500 sccm of ammonia gas; introducing the Al source at a flow rate of 55 μmol/min and the gallium source at a flow rate of 60 μmol/min and a Si source at a flow rate of 2-4 μmol/min into the reaction chamber; and growing the Si-doped AlGaN barrier layer with a thickness of 600 nm.

At step 5, a multi-quantum well $Al_xGa_{1-x}N/Al_yGa_{1-y}N$ (x<y) layer is grown on the n-type AlGaN barrier layer.

Maintaining the growing temperature at 1050° C.; retaining the growing pressure of 120 Torr, the flow rate of 1500 sccm of hydrogen gas, the flow rate of 1500 sccm of ammonia gas; introducing the Al source at a flow rate of 65 μmol/min and the gallium source at a flow rate of 80 μmol/min into the reaction chamber; and growing the $Al_xGa_{1-x}N$ barrier layer with a thickness of 2-7 nm. Then, Maintaining the growing temperature at 1050° C.; retaining the growing pressure of 70 Torr, the flow rate of 1500 sccm of hydrogen gas, the flow rate of 1500 sccm of ammonia gas; introducing the Al source at a flow rate of 80 μmol/min and the gallium source at a flow rate of 65 μmol/min into the reaction chamber; and growing the $Al_yGa_{1-y}N$ barrier layer with a thickness of 2-10 nm and the period of 3-5 of the quantum wells.

At step 6, a p-type AlGaN barrier layer with high Al composition of 40%-60% is grown on the multi-quantum well $Al_xGa_{1-x}N/Al_yGa_{1-y}N$ layer.

Maintaining the growing temperature at 1000° C.; retaining the growing pressure of 100 Torr, the flow rate of 1500 sccm of hydrogen gas, the flow rate of 1500 sccm of ammonia gas; introducing the Al source at a flow rate of 110 μmol/min and the gallium source at a flow rate of 80 μmol/min and a Mg source at a flow rate of 3-5 μmol/min into the reaction chamber; and growing the p-type AlGaN barrier layer with high Al composition with a thickness of 50 nm.

At step 7, a p-type AlGaN barrier layer with low Al composition of 10%-25% is grown on the p-type barrier layer.

Maintaining the growing temperature at 1000° C.; retaining the growing pressure of 100 Torr, the flow rate of 1500 sccm of hydrogen gas, the flow rate of 1500 sccm of ammonia gas; introducing the Al source at a flow rate of 80 μmol/min and the gallium source at a flow rate of 120 μmol/min and the Mg source at a flow rate of 3-5 μmol/min into the reaction chamber; and growing the p-type AlGaN barrier layer with low Al composition with a thickness of 60 nm.

At step 8, a p-type GaN cap layer is grown on the p-type AlGaN barrier layer with low Al composition.

Maintaining the growing temperature at 950° C.; retaining the growing pressure of 70 Torr, the flow rate of 1500 sccm of hydrogen gas, the flow rate of 1500 sccm of ammonia gas; introducing the gallium source at a flow rate of 65 μmol/min and the Mg source at a flow rate of 3-5 μmol/min into the reaction chamber; and growing the p-type GaN cap layer with a thickness of 60 nm.

Figure 7B:
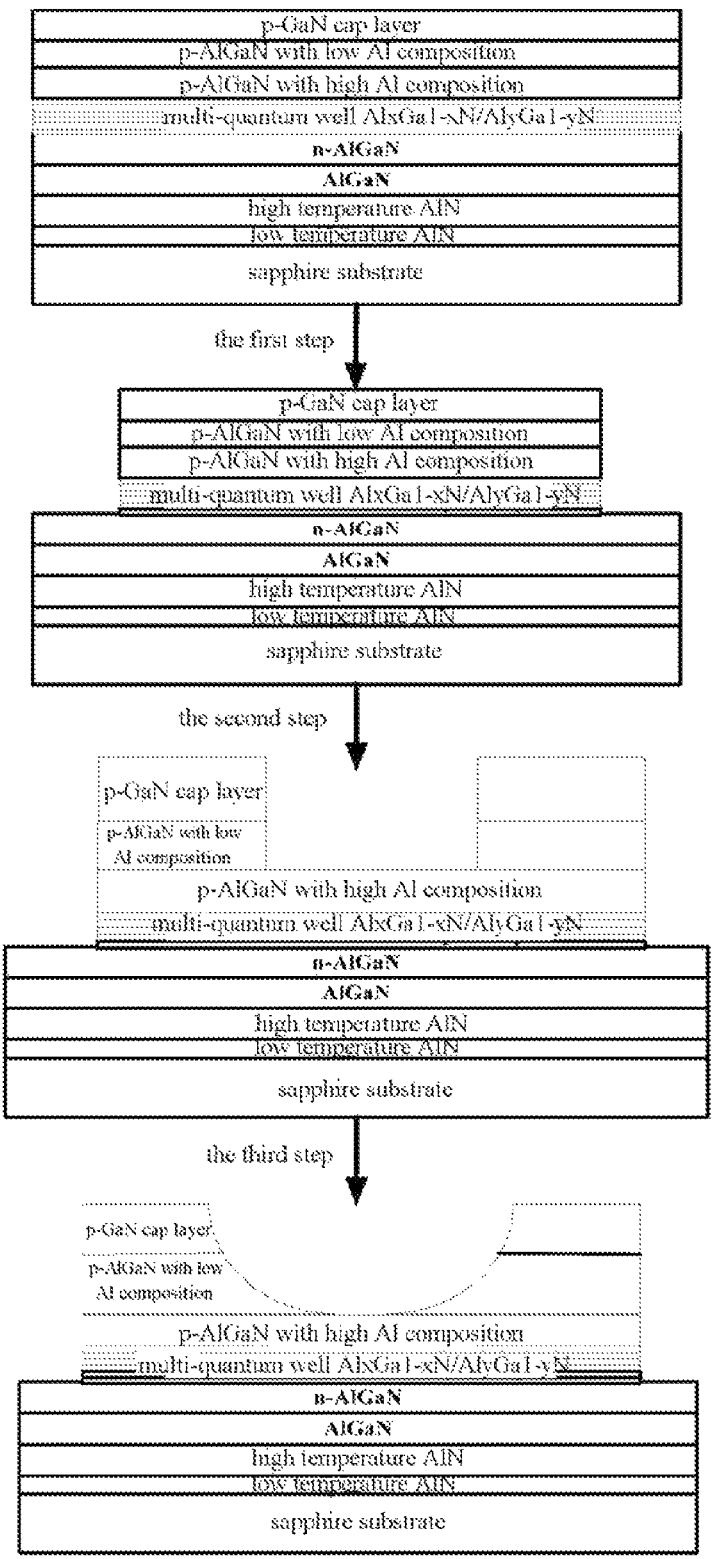
Figure 7C:
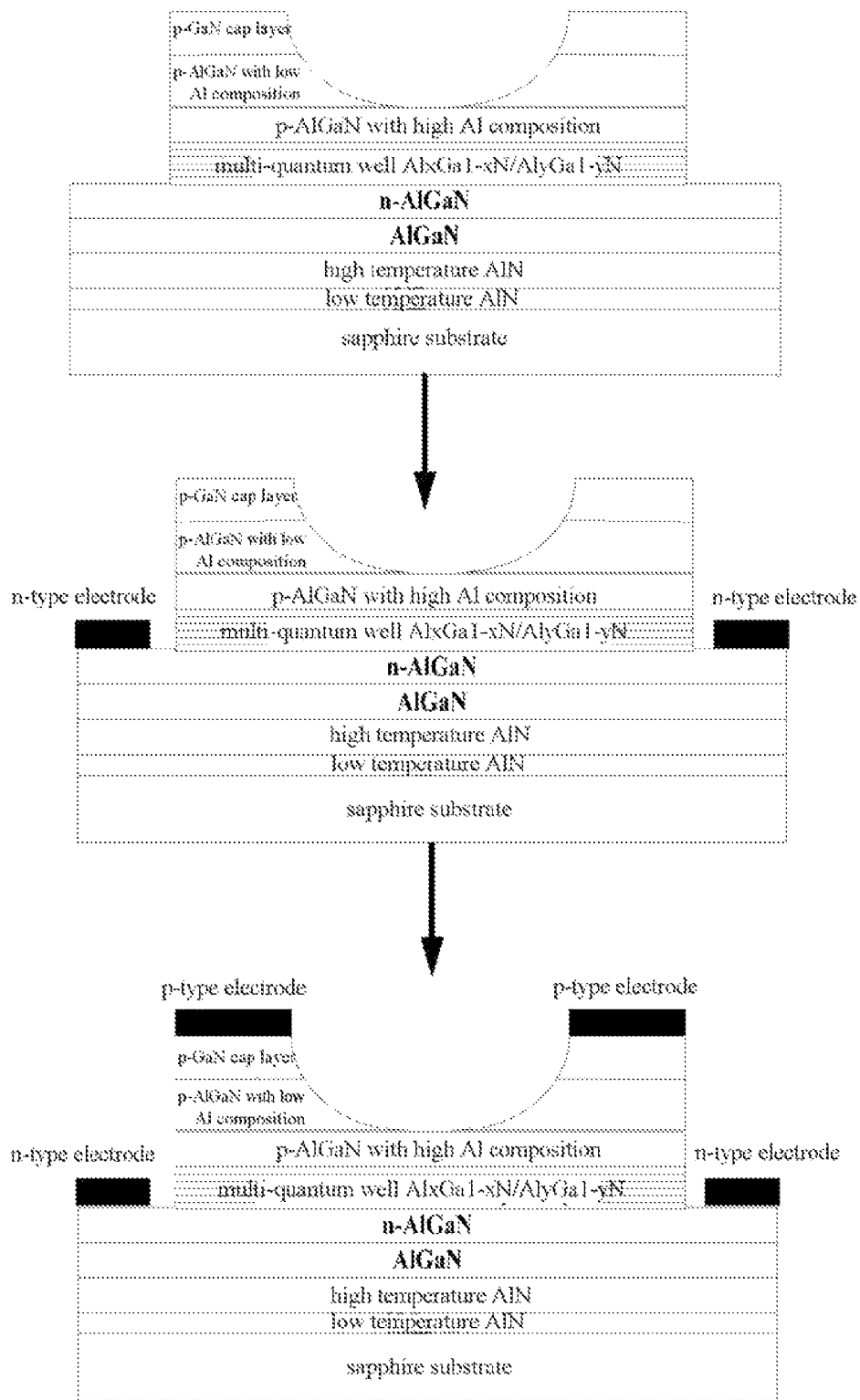

Next, device window fabrication steps are shown in FIG. 7B.

At the first step, a mesa is etched from the p-type GaN cap layer to the n-type AlGaN layer using the ICP or RIE process.

A $SiO_2$ layer with a thickness of about 300 nm, as an etching mask layer, is deposited with the electronic beam evaporation device. Since the etching rate for AlGaN material is relatively slower, adding this step is to form a double-layer mask pattern, including $SiO_2$ and photoresist, on the sample wafer, thereby facilitating the protection of unetched surface.

By coating the positive photoresist on the sample wafer at a rotation speed of 5000 revolutions/min and then baking the coated sample wafer in a baking box at 90° C. for 15 minutes, a desired pattern for etching is formed through photolithography and developing processes;

Forming the mesa using the ICP dry etching, with an etching electrode power of 550 W, a bias voltage of 110V, a pressure of 1.5 Pa, and an etching time of 400 s;

Removing the etched positive photoresist with acetone, then dipping the wafer into BOE for 1 minute so as to remove the $SiO_2$ mask, and cleaning the wafer with de-ionizing water and blowing dry nitrogen gas over the wafer, thereby removing etched mask.

At the second step, by photo-lithographing a circular window on the p-type GaN cap layer, and etching the window again to a half of the depth of the p-type AlGaN barrier layer with low Al composition using the ICP, a cylindrical window is formed.

(1) by coating the positive photoresist on a sample wafer at a rotation speed of 5000 revolutions/min, and then baking the coated sample wafer in a baking box at 90° C. for 15 minutes, a desired window for etching is formed through photolithography and developing processes;

(2) by dry etching the p-type GaN cap layer to the p-type AlGaN barrier layer with low Al composition using the ICP, with an etching gas of $Cl_2/BCl_3$, an etching depth of 90 nm, an etching electrode power of 180 W, a bias voltage of 150V, a pressure of 1 Pa, and an etching time of 230 s, a cylindrical window is formed.

At the third step, by wet etching process with the aid of UV light, a substantially semi-sphere window W is formed.

First, photo-lithographing a mask pattern for wet etching on the n-type AlGaN mesa and the p-type GaN cap layer, and evaporating a metal mask layer Ti for wet etching on the mask pattern region by an electronic beam evaporation process; then putting the sample wafer into a KOH solution at a temperature of 70° C. for 3 minutes, for pre-processing the wafer before the wet etching; then wet etching the sample wafer with the aid of UV light using the KOH electrolyte. The processing parameters for the wet etching are: a He—Cd laser irradiation at 325 nm, a bias voltage of −2V, an etching time of 15 minutes, thereby forming a like semi-sphere window; and putting the sample wafer into an HF solution with a ratio of 1:10, for rinsing off the metal mask layer Ti.

Finally, the electrode fabricating step is illustrated in FIG. 7D.

1) an n-type electrode pattern is photo-lithographed on the n-type AlGaN layer, and an n-type ohmic contact metal is evaporated on the electrode pattern region by an electronic beam evaporation process, thereby forming an n-type electrode.

In order for metal to be better stripped off, coating an adhesive on the sample wafer at a rotation speed of 8000 revolutions/min for 30 seconds, and baking the coated sample wafer in a baking box at 160° C. for 20 minutes, then coating the positive photoresist on the sample wafer at a rotation speed of 5000 revolutions/min, then baking the coated sample wafer in a baking box at 80° C. for 10 minutes, thereby obtaining an n-type electrode pattern through photolithography process;

Removing the thin photoresist layer undeveloped on the pattern region with the DQ-500 plasma photoresist removing machine in order to improve yield in the stripping off step, then depositing Ti/Al/Ti/Au four-layer metal with the VPC-1000 electronic beam evaporation device;

Dipping the deposited sample wafer into acetone solution for 40 minutes, ultrasonic processing the same, and then blowing dry nitrogen gas over the wafer; Putting the sample wafer into a rapid annealing oven, with the annealing oven being provided with nitrogen gas for 10 minutes, then high temperature annealing the sample wafer in nitrogen gas at the temperature of 870° C. for 40 seconds, thereby forming the n-type electrode.

2) a p-type electrode pattern is photo-lithographed on the p-type GaN cap layer, and a p-type ohmic contact metal is evaporated on the electrode pattern region by an electronic beam evaporation process, thereby forming a p-type electrode.

First, coating an adhesive on the sample wafer at a rotation speed of 8000 revolutions/min for 30 seconds, and baking the coated sample wafer in a baking box at 160° C. for 20 minutes, then coating the positive photoresist on the sample wafer by a photoresist coating machine at a rotation speed of 5000 revolutions/min, then baking the coated sample wafer in a baking box at 80° C. for 10 minutes, thereby obtaining the p-type electrode pattern through photolithography process;

Second, removing the thin photoresist layer undeveloped on the pattern region with the DQ-500 plasma photoresist removing machine, then evaporating Ni/Au two-layer metal, as the p-type electrode, on the p-type electrode pattern with the VPC-1100 electronic beam evaporation device;

Finally, dipping the evaporated sample wafer into acetone solution for 20 minutes, ultrasonic processing the same, and then blowing dry nitrogen gas over the wafer; subsequently, putting the sample wafer into a rapid annealing oven filled with air, then high temperature annealing the sample wafer in air at the temperature of 560° C. for 10 minutes, thereby forming the p-type electrode. The fabrication of the device is completed.

Hereinabove the sixth embodiment has been described, the modifications 1-5 of the sixth embodiment will be described below. Herein, detailed descriptions for the same steps are omitted.

Modification 1 of the Sixth Embodiment

The differences between the present modification and the sixth embodiment are as follows:
in the sub-step (2) of the second step of the device fabrication step, by dry etching the p-type GaN cap layer to the p-type AlGaN barrier layer with low Al composition using ICP, with an etching depth of 90 nm, an etching gas of $Cl_2$/$BCl_3$, an etching electrode power of 400 W, a bias voltage of 90V, a pressure of 2 Pa, and an etching time of 160 s, the cylindrical window is formed.

in the third step of the device fabrication step, firstly, photo-lithographing a mask pattern for wet etching on the n-type AlGaN mesa and the p-type GaN cap layer, and evaporating a metal mask layer Ti for wet etching on the mask pattern region by an electronic beam evaporation process; then putting the sample wafer into a KOH solution at a temperature of 70° C. for 3 minutes, for pre-processing the wafer before the wet etching; then wet etching the sample wafer with the aid of UV light using the KOH electrolyte. The processing parameters for the wet etching are: a He—Cd laser irradiation at 325 nm, a bias voltage of −3V, and an etching time of 12 minutes, thereby forming a like semi-sphere window; and putting the sample wafer into an HF solution with a ratio of 1:10, for rinsing off the metal mask layer Ti.

Modification 2 of the Sixth Embodiment

The differences between the present modification and the sixth embodiment are as follows:
in the sub-step (2) of the second step of the device fabrication step, by dry etching the p-type GaN cap layer to the p-type AlGaN barrier layer with low Al composition using ICP, with an etching depth of 90 nm, an etching gas of $Cl_2$/$BCl_3$, an etching electrode power of 600 W, a bias voltage of 0V, a pressure of 3 Pa, and an etching time of 100 s, the cylindrical window is formed.

in the third step of the device fabrication step, firstly, photo-lithographing a mask pattern for wet etching on the n-type AlGaN mesa and the p-type GaN cap layer, and evaporating a metal mask layer Ti for wet etching on the mask pattern region by an electronic beam evaporation process; then putting the sample wafer into a KOH solution at a temperature of 70° C. for 3 minutes, for pre-processing the wafer before the wet etching; then wet etching the sample wafer with the aid of UV light using the KOH electrolyte. The processing parameters for the wet etching are: a He—Cd laser irradiation at 325 nm, a bias voltage of −4V, an etching time of 10 minutes, thereby forming a like semi-sphere window; and putting the sample wafer into an HF solution with a ratio of 1:10, for rinsing off the metal mask layer Ti.

Modification 3 of the Sixth Embodiment

The differences between the present modification and the sixth embodiment are the second and third steps in the device window fabrication step and as follows:
At the second step, by photo-lithographing a circular window on the p-type GaN cap layer, and etching the window again to a half of the depth of the p-type AlGaN barrier layer with low Al composition using the RIE, a cylindrical window is formed.

by coating the photoresist on a sample wafer at a rotation speed of 5000 revolutions/min, and then baking the coated sample wafer in a baking box at 90° C. for 15 minutes, a desired window for etching is formed through photolithography and developing processes;

by dry etching the p-type GaN cap layer to the p-type AlGaN barrier layer with low Al composition using the RIE, with an etching gas of $Cl_2$/$BCl_3$, an etching depth of 90 nm, an etching electrode power of 80 W, a bias voltage of 210V, a pressure of 10 mT, and an etching time of 210 s, the cylindrical window is formed.

At the third step, by wet etching process with the aid of UV light, a substantially semi-sphere window W is formed.

firstly, photo-lithographing a mask pattern for wet etching on the n-type AlGaN mesa and the p-type GaN cap layer, and evaporating a metal mask layer Ti for wet etching on the mask pattern region by an electronic beam evaporation process; then putting the sample wafer into a KOH solution at a temperature of 80° C. for 3 minutes, for pre-processing the wafer before the wet etching; then wet etching the sample wafer with the aid of UV light using the KOH electrolyte. The processing parameters for the wet etching are: a He—Cd laser irradiation at 325 nm, a bias voltage of −4V, and an etching time of 13 minutes, thereby forming a like semi-sphere window; and putting the sample wafer into an HF solution with a ratio of 1:10, for rinsing off the metal mask layer Ti.

Modification 4 of the Sixth Embodiment

The differences between the present modification and the sixth embodiment are the second and third steps in the device window fabrication step and are as follows:

At the second step, by photo-lithographing a circular window on the p-type GaN cap layer, and etching the window again to a half of the depth of the p-type AlGaN barrier layer with low Al composition using the RIE, the cylindrical window is formed.

by coating the photoresist on a sample wafer at a rotation speed of 5000 revolutions/min, and then baking the coated sample wafer in a baking box at 90° C. for 15 minutes, a desired window for etching is formed through photolithography and developing processes;

by dry etching the p-type GaN cap layer to the p-type AlGaN barrier layer with low Al composition using the RIE, with an etching gas of $Cl_2/BCl_3$, an etching depth of 90 nm, an etching electrode power of 350 W, a bias voltage of 485V, a pressure of 7 mT, and an etching time of 155 s, the cylindrical window is formed.

At third step, by wet etching process with the aid of UV light, a substantially semi-sphere window W is formed.

firstly, photo-lithographing a mask pattern for wet etching on the n-type AlGaN mesa and the p-type GaN cap layer, and evaporating a metal mask layer Ti for wet etching on the mask pattern region by an electronic beam evaporation process; then putting the sample wafer into a KOH solution at a temperature of 80° C. for 3 minutes, for pre-processing the wafer before the wet etching; then wet etching the sample wafer with the aid of UV light using the KOH electrolyte. The processing parameters for the wet etching are: a He—Cd laser irradiation at 325 nm, a bias voltage of −5V, an etching time of 10 minutes, thereby forming a like semi-sphere window; and putting the sample wafer into an HF solution with a ratio of 1:10, for rinsing off the metal mask layer Ti.

Modification 5 of the Sixth Embodiment

The differences between the present modification and the sixth embodiment are the second and third steps in the device window fabrication step and are as follows:

At the second step, by photo-lithographing a circular window on the p-type GaN cap layer, and etching the window again to a half of the depth of the p-type AlGaN barrier layer with low Al composition using the RIE, the cylindrical window is formed.

by coating the photoresist on a sample wafer at a rotation speed of 5000 revolutions/min, and then baking the coated sample wafer in a baking box at 90° C. for 15 minutes, a desired window for etching is formed through photolithography and developing processes;

by dry etching the p-type GaN cap layer to the p-type AlGaN barrier layer with low Al composition using the RIE, with an etching gas of $Cl_2/BCl_3$, an etching depth of 90 nm, an etching electrode power of 400 W, a bias voltage of 620V, a pressure of 5 mT, and an etching time of 80 s, the cylindrical window is formed.

At the third step, by wet etching process with the aid of UV light, a substantially semi-sphere window W is formed.

firstly, photo-lithographing a mask pattern for wet etching on the n-type AlGaN mesa and the p-type GaN cap layer, and evaporating a metal mask layer Ti for wet etching on the mask pattern region by an electronic beam evaporation process; then putting the sample wafer into a KOH solution at a temperature of 80° C. for 3 minutes, for pre-processing the wafer before the wet etching; then wet etching the sample wafer with the aid of UV light using the KOH electrolyte. The processing parameters for the wet etching are: a He—Cd laser irradiation at 325 nm, a bias voltage of −6V, and an etching time of 8 minutes, thereby forming a like semi-sphere window; and putting the sample wafer into an HF solution with a ratio of 1:10, for rinsing off the metal mask layer Ti.

In the fifth and sixth embodiments and the modifications thereof, firstly etching the window to the p-type AlGaN barrier layer (8) with low Al composition, then wet etching the sample wafer with the aid of light at a faster etching rate, thereby not only the depth of the final semi-sphere window being not too much, but also the p-type AlGaN barrier layer (7) with high Al composition being reached.

INDUSTRIAL AVAILABILITY

The LED devices and methods for fabricating the same according to present invention are applicable to water processing, medical and biomedicine, and white light illumination.

We claim:

1. An ultraviolet light emitting diode device, wherein:
   the ultraviolet light emitting diode device comprising AlN nucleating layers, an intrinsic AlGaN epitaxial layer, an AlGaN barrier layer of a first conductivity type, an active region, a first AlGaN barrier layer of a second conductivity type, a second AlGaN barrier layer of the second conductivity type and a GaN cap layer of the second conductivity type grown in sequence on a substrate;
   a window is disposed in the GaN cap layer of the second conductivity type so as to emit the light generated; and
   the window penetrates through the GaN cap layer of the second conductivity type and the second AlGaN barrier layer and reaches the first AlGaN barrier layer.

2. The ultraviolet light emitting diode device according to claim 1, wherein:
   the substrate is a SiC substrate or a sapphire substrate;
   if the substrate is the SiC substrate, an electrode of the first conductivity type is formed on the back of the SiC substrate, and an electrode of the second conductivity type is formed on the GaN cap layer of the second conductivity type; and
   if the substrate is the sapphire substrate, an electrode of the first conductivity type is formed on the AlGaN barrier layer of the first conductivity type, and an electrode of the second conductivity type is formed on the GaN cap layer of the second conductivity type.

3. The ultraviolet light emitting diode device according to claim 1, wherein:

from a side close to the substrate, the AN nucleating layers are the 550° C.-650° C. low-temperature nucleating layer and the 920° C.-1050° C. high-temperature nucleating layer, respectively.

4. The ultraviolet light emitting diode device according to claim 1, wherein:
the window has one of shapes of substantially cone, semi-sphere and cylindrical.

5. The ultraviolet light emitting diode device according to claim 4, wherein:
if the window has a substantially cone shape, the bottom of the window is located at two-thirds of the thickness of the first AlGaN barrier layer;
if the window has a substantially semi-sphere shape, the bottom of the window is located at four-fifths of the thickness of the first AlGaN barrier layer;
if the window has a substantially cylindrical shape, the bottom of the window is at three-fourths of the thickness of the first AlGaN barrier layer.

6. The ultraviolet light emitting diode device according to claim 4, wherein:
if the window has a substantially semi-sphere shape, a ratio of top width to bottom width of the window is approximately 2:1, and
if the window has a substantially cylindrical shape, a ratio of depth to width of the window is approximately 1:1000.

7. An ultraviolet light emitting diode device, wherein:
the ultraviolet light emitting diode device comprising AN nucleating layers, an intrinsic AlGaN epitaxial layer, an AlGaN barrier layer of a first conductivity type, an active region, a first AlGaN barrier layer of a second conductivity type, a second AlGaN barrier layer of the second conductivity type and a GaN cap layer of the second conductivity type grown in sequence on a substrate;
a window is disposed in the GaN cap layer of the second conductivity type so as to emit the light generated; and
the window has one of shapes of substantially cone, semi-sphere and cylindrical; and
wherein:
if the window has a substantially cone shape, the bottom of the window is located at two-thirds of the thickness of the first AlGaN barrier layer;
if the window has a substantially semi-sphere shape, the bottom of the window is located at four-fifths of the thickness of the first AlGaN barrier layer; and
if the window has a substantially cylindrical shape, the bottom of the window is at three-fourths of the thickness of the first AlGaN barrier layer.

8. The ultraviolet light emitting diode device according to claim 7, wherein:
if the window has a substantially semi-sphere shape, a ratio of top width to bottom width of the window is approximately 2:1, and
if the window has a substantially cylindrical shape, a ratio of depth to width of the window is approximately 1:1000.

9. The ultraviolet light emitting diode device according to claim 7, wherein:
the substrate is a SiC substrate or a sapphire substrate;
if the substrate is the SiC substrate, an electrode of the first conductivity type is formed on the back of the SiC substrate, and an electrode of the second conductivity type is formed on the GaN cap layer of the second conductivity type; and
if the substrate is the sapphire substrate, an electrode of the first conductivity type is formed on the AlGaN barrier layer of the first conductivity type, and an electrode of the second conductivity type is formed on the GaN cap layer of the second conductivity type.

10. The ultraviolet light emitting diode device according to claim 7, wherein:
from a side close to the substrate, the AN nucleating layers are the 550° C.-650° C. low-temperature nucleating layer and the 920° C.-1050° C. high-temperature nucleating layer, respectively.

* * * * *